United States Patent
Jiang et al.

(10) Patent No.: US 11,751,464 B2
(45) Date of Patent: Sep. 5, 2023

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiaofeng Jiang, Beijing (CN); Linhong Han, Beijing (CN); Huijuan Yang, Beijing (CN); Meng Zhang, Beijing (CN); Jie Dai, Beijing (CN); Xin Zhang, Beijing (CN); Huijun Li, Beijing (CN); Yu Wang, Beijing (CN); Lulu Yang, Beijing (CN); Lu Bai, Beijing (CN); Siyu Wang, Beijing (CN); Yupeng He, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 248 days.

(21) Appl. No.: 17/416,558

(22) PCT Filed: May 6, 2020

(86) PCT No.: PCT/CN2020/088673
§ 371 (c)(1),
(2) Date: Jun. 21, 2021

(87) PCT Pub. No.: WO2021/223080
PCT Pub. Date: Nov. 11, 2021

(65) Prior Publication Data
US 2022/0328574 A1 Oct. 13, 2022

(51) Int. Cl.
*H10K 59/88* (2023.01)
*G09G 3/00* (2006.01)
(Continued)

(52) U.S. Cl.
CPC ............. *H10K 59/88* (2023.02); *G09G 3/006* (2013.01); *H01L 27/0292* (2013.01);
(Continued)

(58) Field of Classification Search
CPC ... H01L 23/544; H01L 23/60; H01L 27/0266; H01L 27/0292; H01L 27/0296;
(Continued)

(56) References Cited

U.S. PATENT DOCUMENTS

2014/0176844 A1 6/2014 Yanagisawa
2018/0033355 A1 2/2018 Lee et al.
(Continued)

FOREIGN PATENT DOCUMENTS

CN 107658233 A 2/2018
CN 108922462 A 11/2018
(Continued)

OTHER PUBLICATIONS

Machine translation of Bao et al. Chinese Patent Document CN 109935571 A Jun. 25, 2019 (Year: 2019).*

*Primary Examiner* — Kevin J Comber
(74) *Attorney, Agent, or Firm* — Lippes Mathias LLP

(57) ABSTRACT

Provided is a display substrate. The display substrate includes: a base substrate, a plurality of sub-pixels, a plurality of data lines, a plurality of data transmission lines, a plurality of electrostatic discharge circuits, a panel crack detection trace, and a plurality of electrostatic discharge dummy circuits. At least one of the electrostatic discharge
(Continued)

dummy circuits may be connected to the panel crack detection trace. A display device is also provided.

20 Claims, 23 Drawing Sheets

(51) Int. Cl.
  *H01L 27/02* (2006.01)
  *H10K 59/131* (2023.01)
  *H02H 9/04* (2006.01)
(52) U.S. Cl.
  CPC ....... *H10K 59/131* (2023.02); *G09G 2330/04* (2013.01); *G09G 2330/12* (2013.01); *H01L 27/0296* (2013.01); *H02H 9/045* (2013.01)
(58) Field of Classification Search
  CPC ...... H10K 59/131; H10K 59/88; G01R 31/28; G09G 3/006; G09G 2300/0426; G09G 2300/0413; G09G 2330/04; G09G 2330/12; H02H 9/045
  USPC .......................................................... 361/56
  See application file for complete search history.

(56) References Cited

U.S. PATENT DOCUMENTS

| | | |
|---|---|---|
| 2019/0057632 A1 | 2/2019 | Kim et al. |
| 2019/0066595 A1* | 2/2019 | Kim ..................... G09G 3/3258 |
| 2020/0025820 A1 | 1/2020 | Zhao et al. |
| 2022/0326558 A1* | 10/2022 | Long ................. G02F 1/136286 |

FOREIGN PATENT DOCUMENTS

| | | | |
|---|---|---|---|
| CN | 109427273 A | | 3/2019 |
| CN | 109427752 A | | 3/2019 |
| CN | 109935571 A | * | 6/2019 |
| CN | 109935571 A | | 6/2019 |
| CN | 209946604 U | | 1/2020 |
| KR | 20190140629 A | | 12/2019 |

* cited by examiner

DISPLAY SUBSTRATE AND DISPLAY DEVICE

CROSS-REFERENCE TO RELATED APPLICATION

This application is a 371 of PCT Application No. PCT/CN2020/088673, filed on May 6, 2020, the disclosure of which is herein incorporated by reference in its entirety.

TECHNICAL FIELD

The present disclosure relates to the field of display technologies, and in particular to a display substrate and a display device.

BACKGROUND

During the manufacturing process of a display substrate, micro cracks that are difficult to observe may appear in the edge of the display substrate, which affects the quality of the display substrate.

SUMMARY

The present disclosure provides a display substrate and a display device. The technical solution is as follows:

In one aspect, a display substrate is provided. The display substrate includes:

a base substrate including a display region and a peripheral region surrounding the display region;

a plurality of sub-pixels disposed in the display region;

a plurality of data lines disposed in the display region and electrically connected to the plurality of sub-pixels;

a plurality of data transmission lines disposed in the peripheral region and electrically connected to the plurality of data lines;

a plurality of electrostatic discharge circuits disposed in the peripheral region and electrically connected to the plurality of data transmission lines, wherein the plurality of electrostatic discharge circuits are arranged along an extension direction of a boundary of the display region;

a panel crack detection trace disposed in the peripheral region and surrounding the display region; and a plurality of electrostatic discharge dummy circuits disposed in the peripheral region and arranged along the extension direction of the boundary of the display region, wherein the plurality of electrostatic discharge dummy circuits are disposed on at least one side of the plurality of electrostatic discharge circuits along the extension direction of the boundary of the display region, and at least one of the plurality of electrostatic discharge dummy circuits is electrically connected to the panel crack detection trace and configured to discharge static electricity on the panel crack detection trace.

Optionally, the boundary of the display region includes a first boundary, a second boundary, a third boundary, and a fourth boundary which are sequentially connected, and the plurality of electrostatic discharge circuits and the plurality of electrostatic discharge dummy circuits are disposed in the peripheral region proximal to the first boundary; and the plurality of electrostatic discharge dummy circuits include a plurality of first electrostatic discharge dummy sub-circuits and a plurality of second electrostatic discharge dummy sub-circuits;

wherein the plurality of first electrostatic discharge dummy sub-circuits and the plurality of second electrostatic discharge dummy sub-circuits are respectively disposed on two sides of the plurality of electrostatic discharge circuits along an extension direction of the first boundary.

Optionally, the panel crack detection trace includes: a first trace segment, a second trace segment, and a third trace segment; wherein the first trace segment is a discontinuous trace, and disposed in the peripheral region proximal to the first boundary of the display region, and the first trace segment is extended along the extension direction of the first boundary;

the second trace segment is a continuous trace, and disposed in the peripheral region proximal to the first boundary, the second boundary and the third boundary, wherein two endpoints of the second trace segment are disposed in the peripheral region proximal to the first boundary;

the third trace segment is a continuous trace, and disposed in the peripheral region proximal to the third boundary, the fourth boundary, and the first boundary, wherein two endpoints of the third trace segment are disposed in the peripheral region proximal to the first boundary, and the second trace segment and the third trace segment are connected to the first trace segment; and the plurality of electrostatic discharge dummy circuits are electrically connected to the first trace segment.

Optionally, the first trace segment includes: a first sub-trace, a second sub-trace, and a third sub-trace which are extended along the extension direction of the first boundary, wherein the first sub-trace and the second sub-trace are disposed on one side of the third sub-trace proximal to the display region;

the first sub-trace and the third sub-trace are respectively connected to two endpoints of the second trace segment, and the second sub-trace and the third sub-trace are respectively connected to two endpoints of the third trace segment; and the plurality of electrostatic discharge dummy circuits are electrically connected to the third sub-trace.

Optionally, the display substrate further includes: a plurality of data transmission dummy lines, wherein the plurality of electrostatic discharge dummy circuits are electrically connected to the third sub-trace by the plurality of data transmission dummy lines.

Optionally, the display substrate further includes: a plurality of first test circuits disposed on one side of the plurality of electrostatic discharge circuits distal from the display region, wherein the plurality of first test circuits are extended and arranged along the extension direction of the first boundary;

at least one of the plurality of first test circuits includes: a first thin film transistor, a first control line, a first test data line, and a second test data line, wherein the first control line, the first test data line, and the second test data line are disposed in the peripheral region and extended along the extension direction of the first boundary; and the first thin film transistor includes: a first source, a first drain, and a first gate, wherein the first gate is electrically connected to the first control line, the first source is electrically connected to the first test data line, the second test data line and one of the first sub-trace and the second sub-trace, and the first drain is electrically connected to one of the plurality of data transmission lines.

Optionally, the display substrate further includes: a plurality of first test dummy circuits, wherein the plurality of first test dummy circuits are disposed on two sides of the plurality of first test circuits and between the plurality of electrostatic discharge dummy circuits and the third sub-trace along the extension direction of the first boundary, and the plurality of first test dummy circuits are electrically connected to the third sub-trace and the electrostatic discharge dummy circuits by the plurality of data transmission dummy lines.

Optionally, at least one of the plurality of first test dummy circuits includes: a first dummy thin film transistor and a second control line, wherein the second control line is disposed in the peripheral region and extended along the extension direction of the first boundary, and the first dummy thin film transistor includes: a first dummy source, a first dummy drain, and a first dummy gate;

wherein the first dummy gate is electrically connected to the second control line, and the first dummy drain is electrically connected to one of the plurality of data transmission dummy lines.

Optionally, the number of the electrostatic discharge dummy circuits is equal to the number of the first test dummy circuits, and each of the electrostatic discharge dummy circuits is electrically connected to the third sub-trace by one of the first test dummy circuits.

Optionally, the display substrate further includes: a plurality of second test circuits, wherein the plurality of second test circuits are disposed between the plurality of electrostatic discharge circuits and the plurality of first test circuits, and the plurality of second test circuits are electrically connected to the plurality of electrostatic discharge circuits and the plurality of first test circuits by the plurality of data transmission lines.

Optionally, at least one of the plurality of second test circuits includes: a first sub-circuit, a second sub-circuit, and a third sub-circuit, wherein the second sub-circuit is disposed between the first sub-circuit and the third sub-circuit, and the first sub-circuit is disposed on one side of the second sub-circuit distal from the plurality of sub-pixels.

Optionally, the plurality of data transmission lines include: a plurality of first data transmission lines and a plurality of second data transmission lines, wherein the plurality of first data transmission lines and the plurality of second data transmission lines are arranged alternately one by one;

the first sub-circuit includes: a second thin film transistor, a third control line, and a third test data line, wherein the third control line and the third test data line are extended along the extension direction of the first boundary; and the second thin film transistor includes: a second source, a second drain, and a second gate, wherein the second source is electrically connected to the third test data line, the second drain is electrically connected to one of the plurality of first data transmission lines, and the second gate is electrically connected to the third control line.

Optionally, the second sub-circuit includes: a third thin film transistor, a fourth thin film transistor, a fourth control line, a fourth test data line, and a fifth test data line, wherein the fourth control line, the fourth test data line, and the fifth test data line are extended along the extension direction of the first boundary;

the third thin film transistor includes: a third source, a third drain, and a third gate, wherein the third source is electrically connected to the fourth test data line, the third drain is electrically connected to one of the plurality of second data transmission lines, and the third gate is electrically connected to the fourth control line; and the fourth thin film transistor includes: a fourth source, a fourth drain, and a fourth gate, wherein the fourth source is electrically connected to the fifth test data line, the fourth drain is electrically connected to one of the plurality of second data transmission lines, and the fourth gate is electrically connected to the fourth control line.

Optionally, the third sub-circuit includes: a fifth thin film transistor, a sixth thin film transistor, a fifth control line, a sixth test data line, and a seventh test data line, wherein the fifth control line, the sixth test data line, and the seventh test data line are extended along the extension direction of the first boundary;

the fifth thin film transistor includes: a fifth source, a fifth drain, and a fifth gate, wherein the fifth source is electrically connected to the sixth test data line, the fifth drain is electrically connected to one of the plurality of second data transmission lines, and the fifth gate is electrically connected to the fifth control line; and the sixth thin film transistor includes: a sixth source, a sixth drain, and a sixth gate, wherein the sixth source is electrically connected to the seventh test data line, the sixth drain is electrically connected to one of the plurality of second data transmission lines, and the sixth gate is electrically connected to the fifth control line.

Optionally, the display substrate further includes: a plurality of second test dummy circuits, wherein the plurality of second test dummy circuits are disposed on two sides of the plurality of second test circuits and disposed between the plurality of electrostatic discharge dummy circuits and the plurality of first test dummy circuits along the extension direction of the first boundary, and the plurality of second test dummy circuits are electrically connected to the first test dummy circuits and the electrostatic discharge dummy circuits by the plurality of data transmission dummy lines.

Optionally, at least one of the plurality of second test dummy circuits includes: a first dummy sub-circuit, a second dummy sub-circuit, and a third dummy sub-circuit, wherein the second dummy sub-circuit is disposed between the first dummy sub-circuit and the third dummy sub-circuit, and the first dummy sub-circuit is disposed on one side of the second dummy sub-circuit distal from the plurality of sub-pixels.

Optionally, the plurality of data transmission dummy lines include: a plurality of first data transmission dummy lines and a plurality of second data transmission dummy lines, wherein the plurality of first data transmission dummy lines and the plurality of second data transmission dummy lines are alternately arranged one by one; and the first dummy sub-circuit includes: a second dummy thin film transistor, a sixth control line, and an eighth test data line, wherein the sixth control line and the eighth test data line are extended along the extension direction of the first boundary, and the second dummy thin film transistor includes: a second dummy source, a second dummy drain, and a second dummy gate, wherein the second dummy drain is electrically connected to one of the plurality of first data transmission dummy lines, and the second dummy gate is electrically connected to the sixth control line.

Optionally, the second dummy sub-circuit includes: a third dummy thin film transistor, a fourth dummy thin film transistor, a seventh control line, a ninth test data line, and a tenth test data line, wherein the seventh control line, the ninth test data line, and the tenth test data line are extended along the extension direction of the first boundary;

the third dummy thin film transistor includes: a third dummy source, a third dummy drain, and a third dummy gate, wherein the third dummy drain is electrically connected to one of the plurality of second data transmission dummy lines, and the third dummy gate is electrically connected to the seventh control line; and the fourth dummy thin film transistor includes: a fourth dummy source, a fourth dummy drain, and a fourth dummy gate, wherein the fourth dummy drain is electrically connected to one of the plurality of second data transmission dummy lines, and the fourth dummy gate is electrically connected to the seventh control line.

Optionally, the third dummy sub-circuit includes: a fifth dummy thin film transistor, a sixth dummy thin film transistor, an eighth control line, an eleventh test data line, and a twelfth test data line, wherein the eighth control line, the eleventh test data line, and the twelfth test data line are extended along the extension direction of the first boundary;

the fifth dummy thin film transistor includes: a fifth dummy source, a fifth dummy drain, and a fifth dummy gate, wherein the fifth dummy drain is electrically connected to one of the plurality of second data transmission dummy lines, and the fifth dummy gate is electrically connected to the eighth control line; and the sixth dummy thin film transistor includes: a sixth dummy source, a sixth dummy drain, and a sixth dummy gate, wherein the sixth dummy drain is electrically connected to one of the plurality of second data transmission dummy lines, and the sixth dummy gate is electrically connected to the eighth control line.

Optionally, the number of the second test dummy circuits, the number of the electrostatic discharge dummy circuits, and the number of the first test dummy circuits are equal, and each of the electrostatic discharge dummy circuits is electrically connected to one of the first test dummy circuits by one of the second test dummy circuits.

Optionally, the display substrate further includes: at least one first signal input terminal;

wherein the at least one first signal input terminal is connected to the third sub-trace in the first trace segment in the panel crack detection trace, and the at least one first signal input terminal is configured to receive a test signal to detect the display substrate.

Optionally, the at least one first signal input terminal includes two first signal input terminals, wherein the two first signal input terminals are respectively disposed on two sides of the first test circuits.

Optionally, the display substrate further includes: a first detection terminal and a second detection terminal; wherein the first detection terminal is connected to the first sub-trace in the first trace segment in the panel crack detection trace, and configured to provide a detection signal for the first sub-trace; and the second detection terminal is connected to the second sub-trace in the first trace segment in the panel crack detection trace, and configured to receive the detection signal to detect the display substrate.

Optionally, at least one of the plurality of electrostatic discharge dummy circuits includes: an electrostatic protection line, at least one first discharge transistor, and at least one second discharge transistor; wherein both a first electrode and a gate of the at least one first discharge transistor are electrically connected to the panel crack detection trace, and a second electrode of the at least one first discharge transistor is electrically connected to the electrostatic protection line; and both a first electrode and a gate of the at least one second discharge transistor are electrically connected to the electrostatic protection line, and a second electrode of the at least one second discharge transistor is electrically connected to the panel crack detection trace.

Optionally, the plurality of electrostatic discharge dummy circuits are uniformly distributed in the peripheral region along the boundary of the display region.

In another aspect, a display device is provided. The display device includes: the display substrate as defined in the above aspect.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

The present disclosure will be described in further detail referring to the accompanying drawings, to make the purposes, technical solutions, and advantages of the present disclosure more clear.

In the related art, in order to detect whether there is a crack in the edge of a display substrate, a panel crack detection (PCD) trace is usually disposed in the edge region of a base substrate 001 of the display substrate. The PCD trace is a ring-shaped trace surrounding a display region of the base substrate. One end and the other end of the PCD trace are both connected to a detection circuit to form a loop. The detection circuit is configured to input a detection signal to one end of the PCD, and may detect whether the detection signal can be received from the other end of the PCD trace.

However, as the PCD trace needs to surround the display region of the base substrate 001, a length of the PCD trace is relatively long, which is easy to accumulate static electricity on the PCD trace during the manufacturing process of the display substrate. The accumulated static electricity easily causes other traces in the display substrate to be burnt out, and a yield of the display substrate is relatively low.

Figure 1:
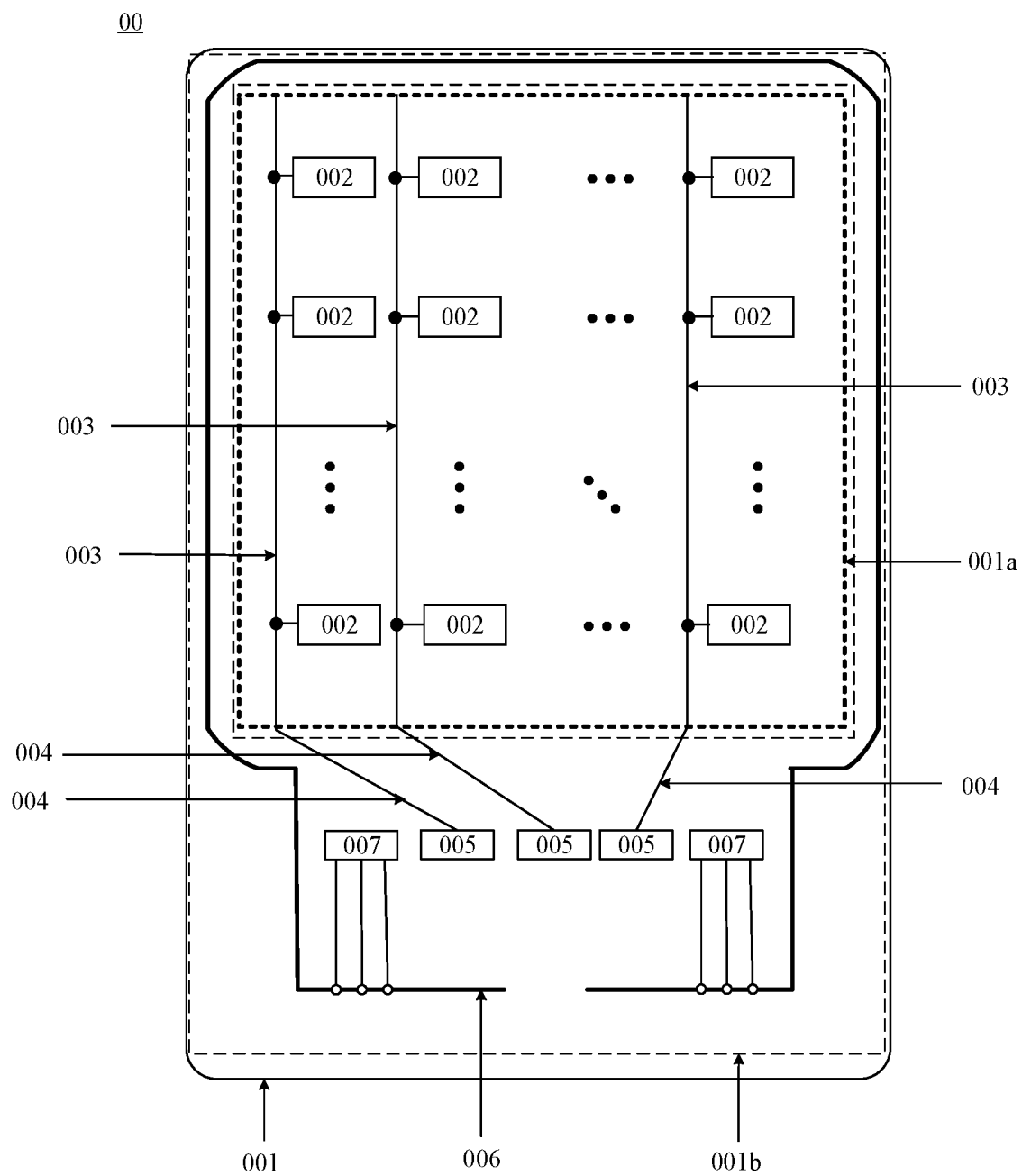
FIG. 1 is a structural schematic diagram of a display substrate according to an embodiment of the present disclosure.

FIG. 1 is a structural schematic diagram of a display substrate according to an embodiment of the present disclosure. Referring to FIG. 1, it can be seen that the display substrate 00 may include: a base substrate 001, a plurality of sub-pixels 002, a plurality of data lines 003, a plurality of data transmission lines 004, a plurality of electrostatic discharge (ESD) circuits 005, a panel crack detection trace 006, and a plurality of electrostatic discharge dummy circuits 007. Exemplarily, FIG. 1 shows 9 sub-pixels 002, 3 data lines 003, 3 data transmission lines 004, 3 electrostatic discharge circuits 005, and 2 electrostatic discharge dummy circuits 007. The base substrate 001 may have a display region 001a and a peripheral region 001b surrounding the display region 001a.

Referring to FIG. 1, the plurality of sub-pixels 002 may be disposed in the display region 001a, and the plurality of data lines 003 may be disposed in the display region 001a and electrically connected to the plurality of sub-pixels 002. For example, each of the plurality of data lines 003 may be electrically connected to a column of sub-pixels 002 in the plurality of sub-pixels 002.

The plurality of data transmission lines 004 may be disposed in the peripheral region 001b, and electrically connected to the plurality of data lines 003. For example, each of the plurality of data transmission line 004 may be electrically connected to one data line 003.

The plurality of electrostatic discharge circuits 005 may be disposed in the peripheral region 001b and electrically connected to the plurality of data transmission lines 004, and the plurality of electrostatic discharge circuits 005 may be arranged along an extension direction of a boundary of the display region 001a. That is, the electrostatic discharge circuit 005 may be electrically connected to the data line 003 by the data transmission line 004, and may be configured to discharge the static electricity on the data line 003.

The panel crack detection trace 006 may be disposed in the peripheral region 001b and surround the display region 001a. That is, the panel crack detection trace 006 may be a ring-shaped trace surrounding the display region 001a.

The plurality of electrostatic discharge dummy circuits 007 may be disposed in the peripheral region 001b and arranged along the extension direction of the boundary of the display region 001a. The plurality of electrostatic discharge dummy circuits 007 are disposed on at least one side of the plurality of electrostatic discharge circuits 005 along the extension direction of the boundary of the display region 001a. At least one electrostatic discharge dummy circuit 007 of the plurality of electrostatic discharge dummy circuits 007 is connected to the panel crack detection trace 006, and may be configured to discharge the static electricity on the panel crack detection trace 006.

It should be noted that during the manufacturing process of the display substrate 00, the electrostatic discharge circuits 005 need to be manufactured in the peripheral region 001b of the base substrate 001. The electrostatic discharge circuits 005 are electrically connected to the data transmission lines 004 in the display substrate 00. The data transmission lines 004 are electrically connected to the data lines 003, and the electrostatic discharge circuits 005 may be configured to discharge static electricity in the data lines 003. When the electrostatic discharge circuits 005 are manufactured, in order to ensure a manufacturing accuracy of the electrostatic discharge circuits 005 electrically connected to the data transmission lines 004, the electrostatic discharge circuits 005 not electrically connected to the data transmission lines 004, that is, the electrostatic discharge dummy circuits 007, may be manufactured on the base substrate 001. In the embodiment of the present disclosure, the electrostatic discharge dummy circuits 007 disposed in the display substrate may be connected to the panel crack detection trace 006, such that the static electricity in the panel crack detection trace 006 can be discharged.

In summary, the embodiment of the present disclosure provides a display substrate. The display substrate includes: the base substrate, the plurality of sub-pixels, the plurality of data lines, the plurality of data transmission lines, the plurality of electrostatic discharge circuits, the panel crack detection trace, and the plurality of electrostatic discharge dummy circuits. At least one of the plurality of electrostatic discharge dummy circuits can be connected to the panel crack detection trace. According to the solution provided by the present disclosure, the static electricity accumulated on the panel crack detection trace can be released by the electrostatic discharge dummy circuits, thereby preventing other traces in the display substrate from being burnt out due to the static electricity accumulated on the panel crack detection trace, and improving a yield of the display substrate.

Figure 2:
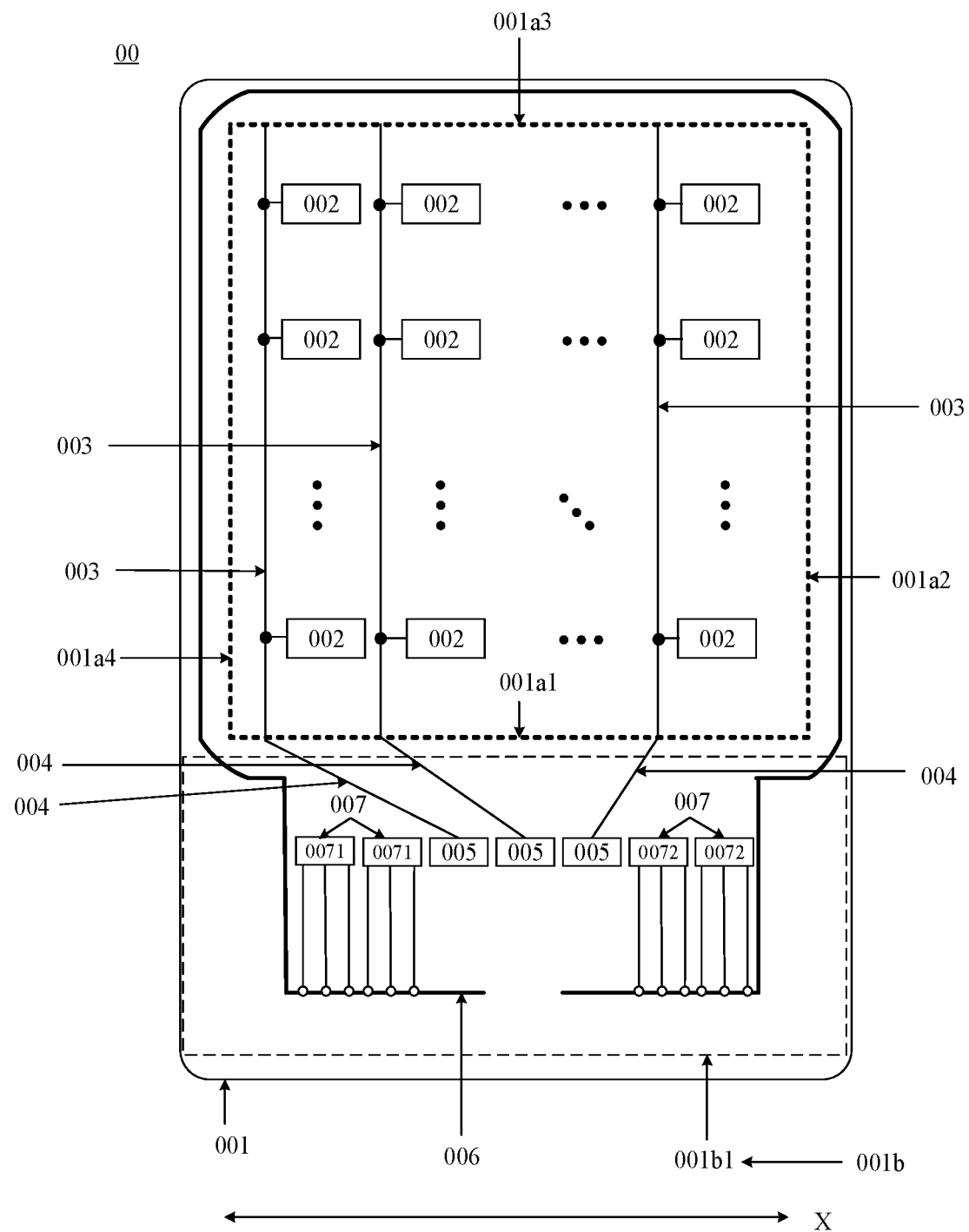
FIG. 2 is a structural schematic diagram of another display substrate according to an embodiment of the present disclosure.

FIG. 2 is a structural schematic diagram of another display substrate according to an embodiment of the present disclosure. Referring to FIG. 2, it can be seen that the boundary of the display region 001a may include a first boundary 001a1, a second boundary 001a2, a third boundary 001a3, and a fourth boundary 001a4 which are sequentially connected. The plurality of electrostatic discharge circuits 005 and the plurality of electrostatic discharge dummy circuits 007 may be disposed in the peripheral region 001b1 proximal to the first boundary 001a1.

Referring to FIG. 2, the plurality of electrostatic discharge dummy circuits 007 may include a plurality of first electrostatic discharge dummy sub-circuits 0071 and a plurality of second electrostatic discharge dummy sub-circuits 0072. For example, two first electrostatic discharge dummy sub-circuits 0071 and two second electrostatic discharge dummy sub-circuits 0072 are shown in FIG. 2.

In the extension direction X along the first boundary 001a1, the plurality of first electrostatic discharge dummy sub-circuits 0071 and the plurality of second electrostatic discharge dummy sub-circuits 072 may be disposed on two sides of the plurality of electrostatic discharge circuits 005 respectively. That is, the electrostatic discharge dummy circuits 007 are disposed on two sides of the plurality of electrostatic discharge circuits 005, such that at least one of the plurality of first electrostatic discharge dummy circuits 007 may be connected to the panel crack detection trace 006, and at least one of the plurality of second electrostatic discharge dummy circuits 007 is connected to the panel crack detection trace 006. Since the first electrostatic discharge dummy circuits 0071 and the second electrostatic discharge dummy circuits 0072 are disposed on two sides of the plurality of electrostatic discharge circuits 005 respectively, the first electrostatic discharge dummy circuits 0071 and the second electrostatic discharge dummy circuits 0072 may respectively discharge the static electricity in different areas of the panel crack detection trace 006, such that the discharge reliability of the static electricity is better, and the yield of the display substrate is higher.

It should be noted that during the manufacturing process of the display substrate 00, the part of the panel crack detection trace 006 disposed in the peripheral region 001b1 proximal to the first boundary 001a1 is more likely to accumulate the static electricity than other areas. Therefore, the electrostatic discharge dummy circuits 007 are disposed in the peripheral region 001b1 proximal to the first boundary 001a1, which facilitates the discharge of the static electricity in the part of the panel crack detection trace 006 disposed in the peripheral region 001b1 proximal to the first boundary 001a1. Other traces in the display substrate are prevented from being burnt out due to more static electricity accumulated in the panel crack detection trace 006, and the yield of the display substrate 00 is ensured.

Figure 3:
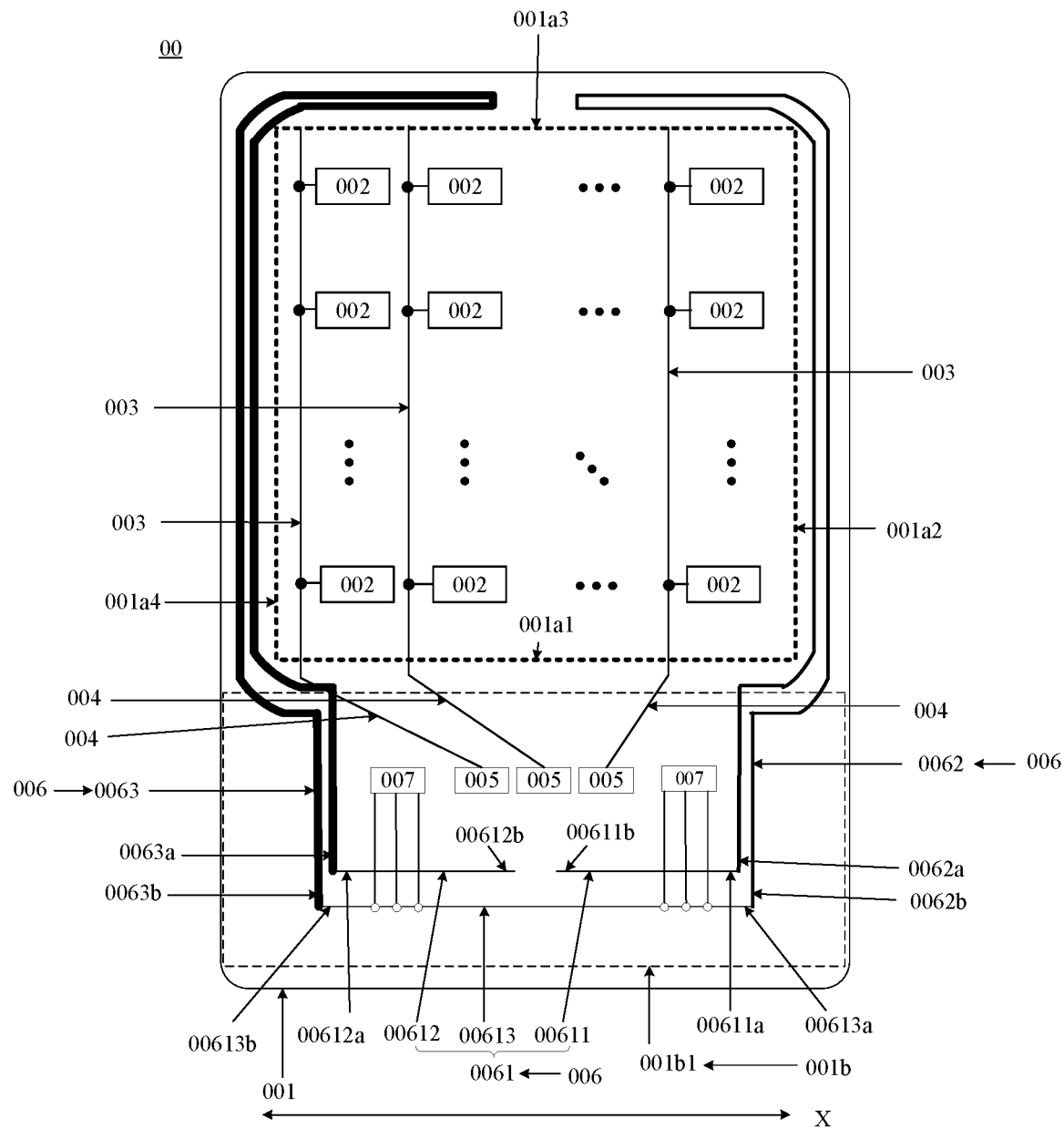
FIG. 3 is a structural schematic diagram of yet another display substrate according to an embodiment of the present disclosure.

FIG. 3 is a structural schematic diagram of yet another display substrate according to an embodiment of the present disclosure. Referring to FIG. 3, it can also be seen that the panel crack detection trace 006 includes: a first trace segment 0061, a second trace segment 0062, and a third trace segment 0063.

The first trace segment 0061 is a discontinuous trace, the first trace segment 0061 is disposed in the peripheral region 001b proximal to the first boundary 001a1 of the display region 001a, and the first trace segment 0061 is extended along the extension direction of the first boundary 001a1.

The second trace segment 0062 is a continuous trace, the second trace segment 0062 is disposed in the peripheral region 001b proximal to the first boundary 001a1, the second boundary 001a2, and the third boundary 001a3, wherein two endpoints 0062a and 0062b of the second trace segment 0062 are disposed in the peripheral region 001b1 proximal to the first boundary 001a1, and the second trace segment 0062 is connected to the first trace segment 0061.

The third trace segment 0063 is a continuous trace. The third trace segment 0063 is disposed in the peripheral region 001b proximal to the third boundary 001a3, the fourth boundary 001a4, and the first boundary 001a1, wherein two endpoints 0063a and 0063b of the third trace segment 0063 are disposed in the peripheral region 001b1 proximal to the first boundary 001a1, and the third trace segment 0063 is connected to the first trace segment 0061.

The plurality of electrostatic discharge dummy circuits 007 are electrically connected to the first trace segment 0061, thereby discharging the static electricity in the first trace segment 0061, the second trace segment 0062 and the third trace segment 0063 which are connected to the first trace segment 0061.

Referring to FIG. 3, it can also be seen that the first trace segment 0061 may include: a first sub-trace 00611, a second sub-trace 00612, and a third sub-trace 00613 which are extended along the extension direction X of the first boundary 001a1. The first sub-trace 00611 and the second sub-trace 00612 are disposed on one side of the third sub-trace 00613 proximal to the display region 001a.

Referring to FIG. 3, the first end 00611a of the first sub-trace 00611 may be connected to the first end 0062a of the second trace segment 0062, and the first end 00613a of the third sub-trace 00613 may be connected to the second end 0062b of the second sub-trace segment 0062. The first end 00612a of the second sub-trace 00612 may be connected to the first end 0063a of the third trace segment 0063, and the second end 00613b of the third sub-trace 00613 may be connected to the second end 0063b of the third trace segment 0063. In addition, there is a gap between the second end 00611b of the first sub-trace 00611 and the second end 00612b of the second sub-trace 00612. The plurality of electrostatic discharge dummy circuits 007 may be connected to the third sub-trace 00613.

It should be noted that the first trace segment 0061, the second trace segment 0062, and the third trace segment 0063 may be prepared by a same patterning process, or may be prepared by different patterning processes, which is not limited by the embodiment of the present disclosure. Lines of different thicknesses are used in FIG. 3 to indicate the first trace segment 0061, the second trace segment 0062, and the third trace segment 0063, just to distinguish the respective trace segments, and do not indicate the actual trace width of the respective trace segments. In the embodiment of the present disclosure, the trace widths of the first trace segment 0061, the second trace segment 0062, and the third trace segment 0063 may be the same.

Figure 4:
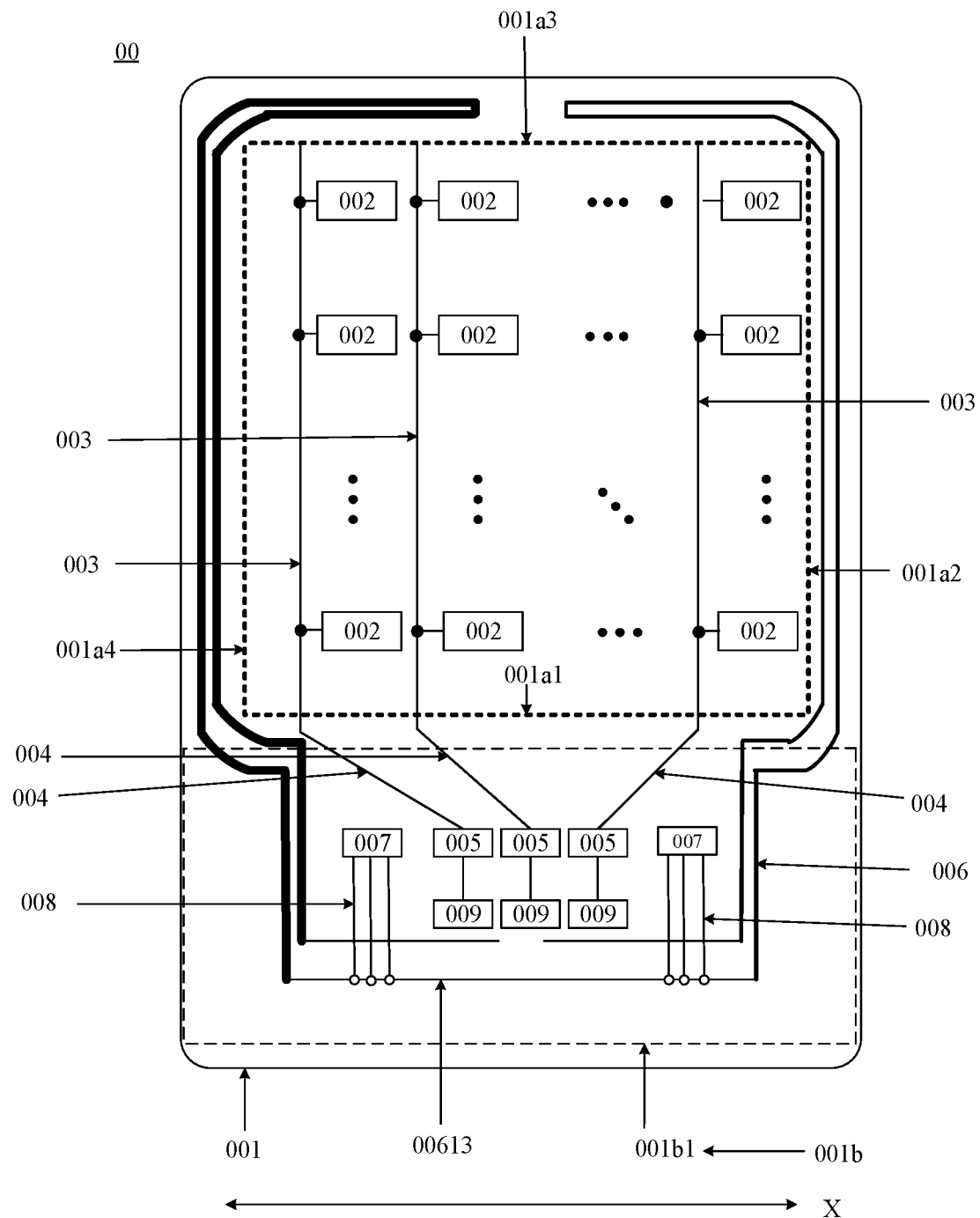
FIG. 4 is a structural schematic diagram of still a further display substrate according to an embodiment of the present disclosure.

FIG. 4 is a structural schematic diagram of still a further display substrate according to an embodiment of the present disclosure. Referring to FIG. 4, the display substrate 00 may further include: a plurality of data transmission dummy lines 008, wherein the plurality of electrostatic discharge dummy circuits 007 are connected to the third sub-trace 00613 by the plurality of data transmission dummy lines 008, thereby realizing the connection between the electrostatic discharge dummy circuits 007 and the third sub-trace 00613 to discharge the static electricity. Exemplarily, each of the plurality of electrostatic discharge dummy circuits 007 may be connected to the third sub-trace 00613 by one data transmission dummy line 008.

Referring to FIG. 4, it can be seen that the display substrate 00 may further include: a plurality of first test circuits 009. For example, three first test circuits 009 are shown in FIG. 4. The plurality of first test circuits 009 may be disposed on one side of the plurality of electrostatic discharge circuits 005 distal from the display region 001a, wherein the plurality of first test circuits 009 may be extended along the extension direction X of the first boundary 001a1.

Figure 5:
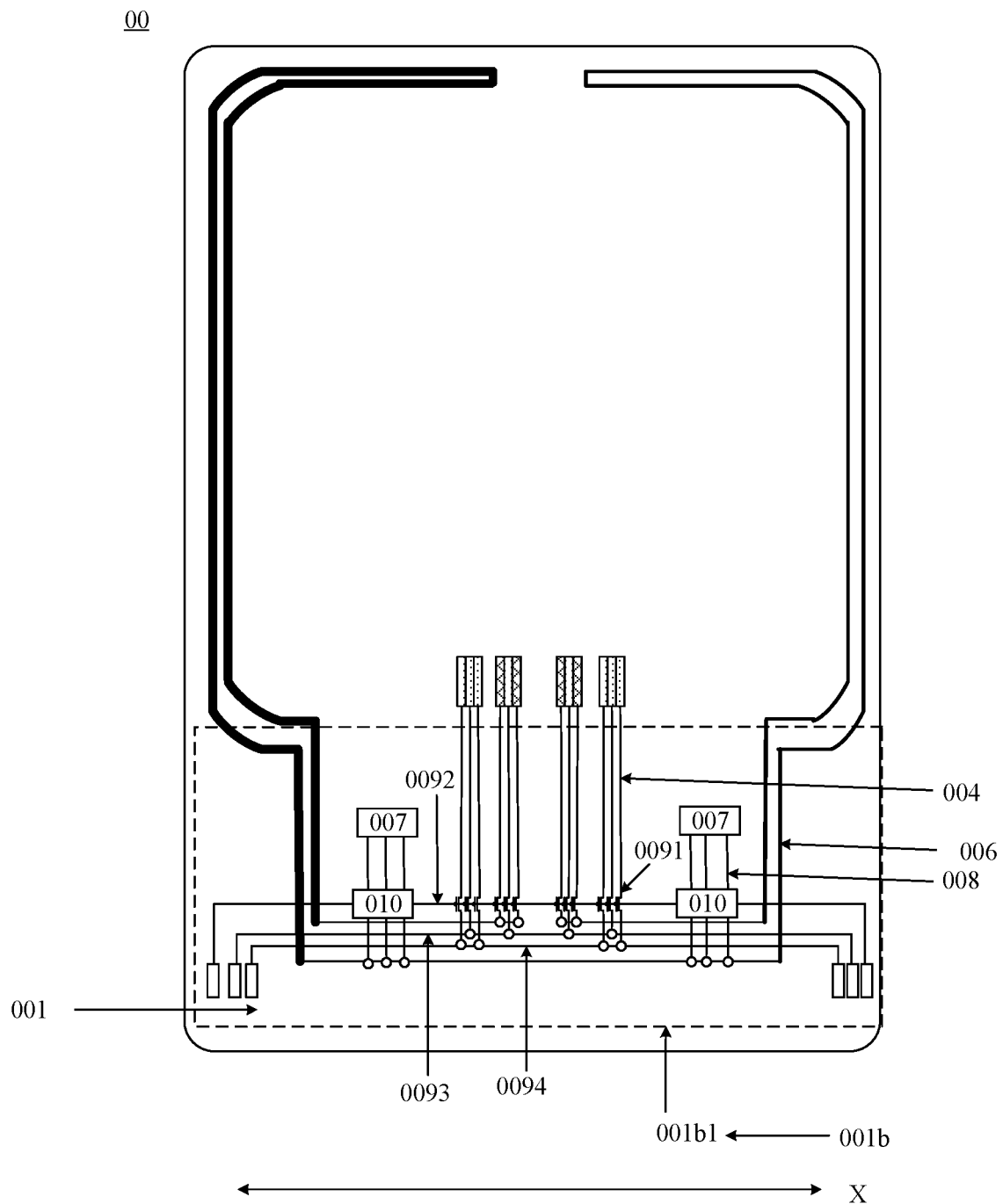
FIG. 5 is a structural schematic diagram of one more display substrate according to an embodiment of the present disclosure.
Figure 6:
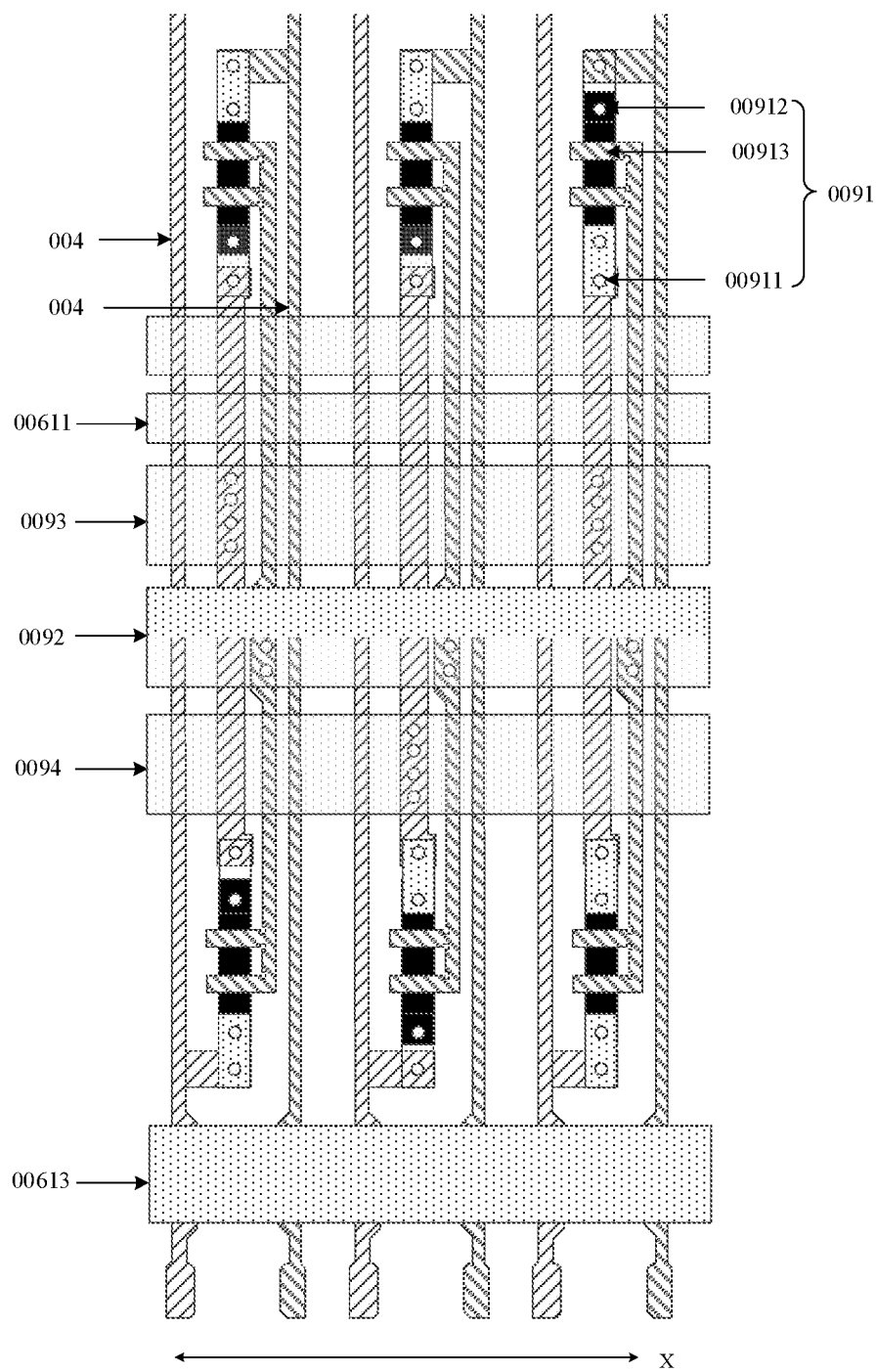
FIG. 6 is a structural schematic diagram of a first test circuit according to an embodiment of the present disclosure.

FIG. 5 is a structural schematic diagram of one more display substrate according to an embodiment of the present disclosure. FIG. 6 is a structural schematic diagram of a first test circuit according to an embodiment of the present disclosure. It can be seen in combination with FIG. 5 and FIG. 6 that the first test circuit 009 may include: a first thin film transistor 0091, a first control line 0092, a first test data line 0093, and a second test data line 0094. The first control line 0092, the first test data line 0093, and the second test data line 0094 may be disposed in the peripheral region 001b and extended along the extension direction X of the first boundary 001a1.

Figure 7:
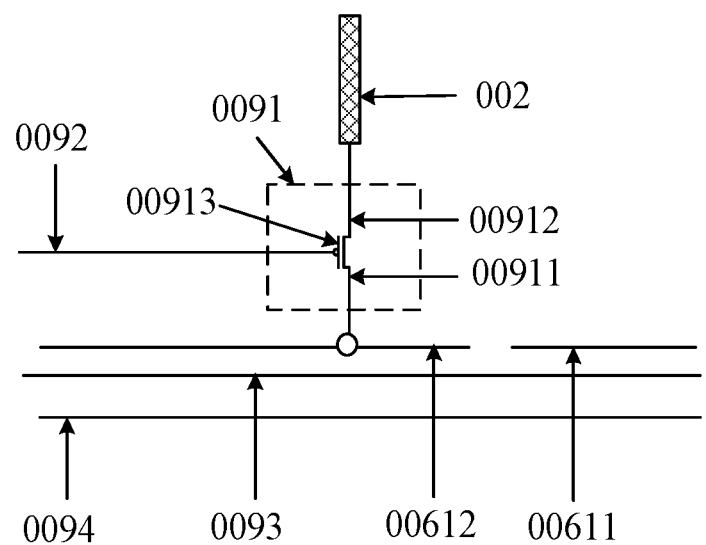
FIG. 7 is a partial schematic diagram of the display substrate shown in FIG. 5.

FIG. 7 is a partial schematic diagram of the display substrate shown in FIG. 5. In combination with FIG. 6 and FIG. 7, the first thin film transistor 0091 may include: a first source 00911, a first drain 00912, and a first gate 00913. The first gate 00913 may be electrically connected to the first control line 0092. The first source 00911 may be electrically connected to the first test data line 0093, the second test data line 0094, and one of the first sub-trace 00611 and the second sub-trace 00612. The first drain 00912 may be electrically connected to one of the plurality of data transmission lines 004. The first source 00911 in FIG. 7 may be electrically connected to the second sub-trace 00612.

The first control line 0092 may provide a gate drive signal for the first gate 00913 of the first thin film transistor 0091. The gate drive signal may also be referred to as a cell test switch (CTS) signal. If the first thin film transistor 0091 is a thin film transistor for driving red (R) sub-pixels or blue (B) sub-pixels to emit light, the drain of the first thin film transistor 0091 may be electrically connected to the first test data line 0093, and the first test data line 0093 is configured to provide a data signal for the red sub-pixels and the blue sub-pixels. If the first thin film transistor 0091 is a thin film transistor for driving green (G) sub-pixels to emit light, the first drain 00912 of the first thin film transistor 0091 may be electrically connected to the second test data line 0094 and one of the first sub-trace 00611 and the second sub-trace 00612. The second test data line 0094, the first sub-trace 00611, or the second sub-trace 00612 is configured to provide a data signal for the green sub-pixels.

It should be noted that during the test of a back plate, the drive signal of the first thin film transistor 0091 provided by the second test data line 0094 to the green sub-pixels is the same as the drive signal of the first thin film transistor 0091 provided by the first test data line 0093 to the red sub-pixels or to the blue sub-pixels.

It should be noted that during the manufacturing process of the display substrate, the first test circuit 009 needs to be manufactured in the peripheral region 001b1 of the base substrate 001 proximal to the first boundary 001a1, and the first test circuit 009 is electrically connected to sub-pixels 002 in the display substrate 00 to detect the light-emitting performance of the sub-pixels 002. When the first test circuit 009 is manufactured, in order to ensure a manufacturing accuracy of the first test circuit 009 electrically connected to the sub-pixels 002, a test circuit not electrically connected to the sub-pixels 002, that is, a first test dummy circuit 010, may be manufactured on the base substrate 001. In the embodiment of the present disclosure, the electrostatic discharge dummy circuit 007 disposed in the display substrate 00 may be connected to the panel crack detection trace 006 by the first test dummy circuit 010, thereby optimizing the traces and circuit arrangement of the back plate.

Figure 8:
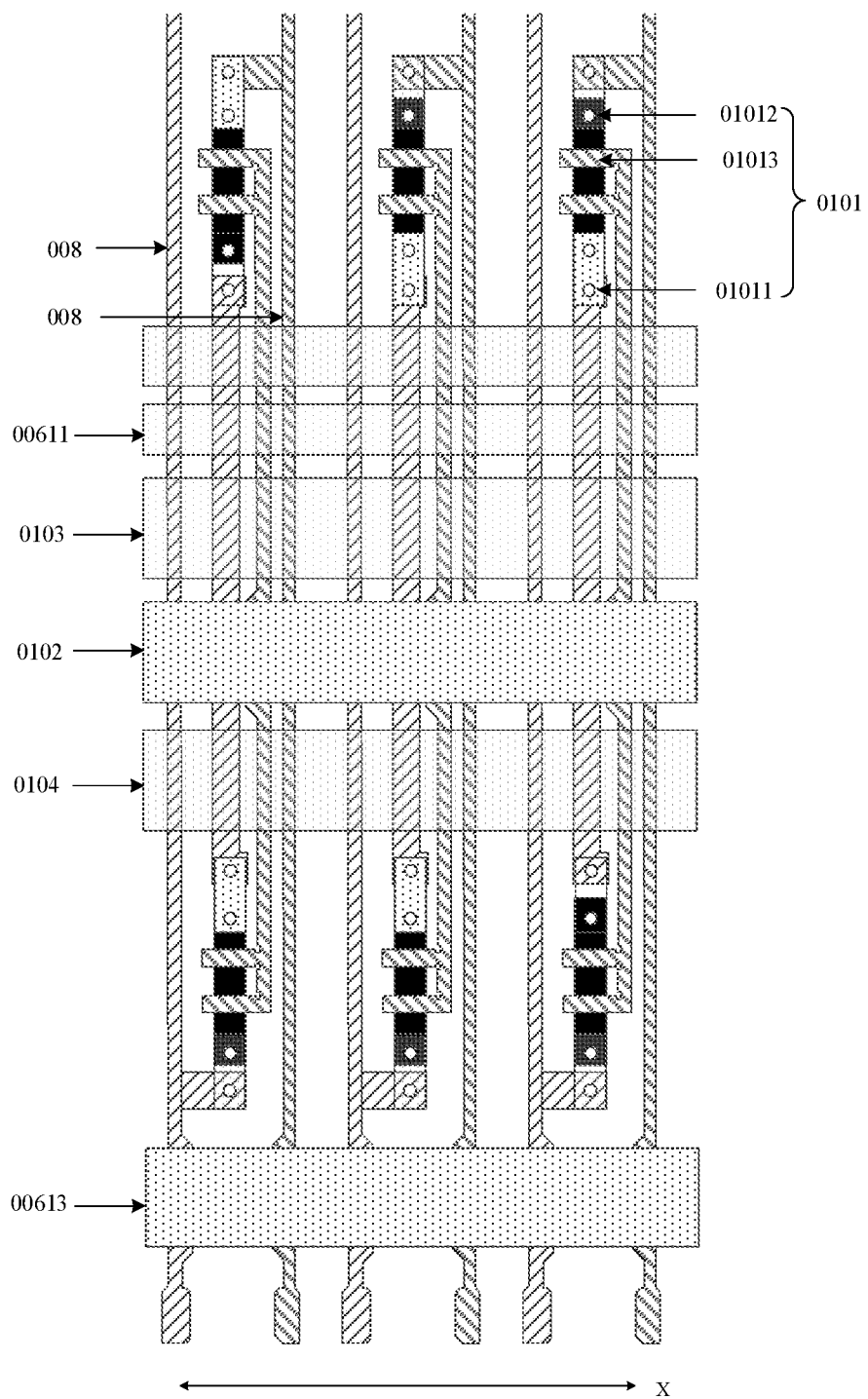
FIG. 8 is a structural schematic diagram of a first test dummy circuit according to an embodiment of the present disclosure.

FIG. 8 is a schematic diagram of the first test dummy circuit according to an embodiment of the present disclosure. It can be seen in combination with FIG. 5 and FIG. 8 that the display substrate 00 may further include: a plurality of first test dummy circuits 010. The plurality of first test dummy circuits 010 are disposed on two sides of the plurality of first test circuit 009 and between the plurality of electrostatic discharge dummy circuits 007 and the third sub-trace 00613 along the extension direction X of the first boundary 001a1. The plurality of first test dummy circuits 010 are electrically connected to the third sub-trace 00613 and the electrostatic discharge dummy circuits 007 by a plurality of data transmission dummy lines 008. That is, the electrostatic discharge dummy circuits 007 may be connected to the third sub-trace 00613 by the first test dummy circuits 010 to discharge the static electricity.

Figure 9:
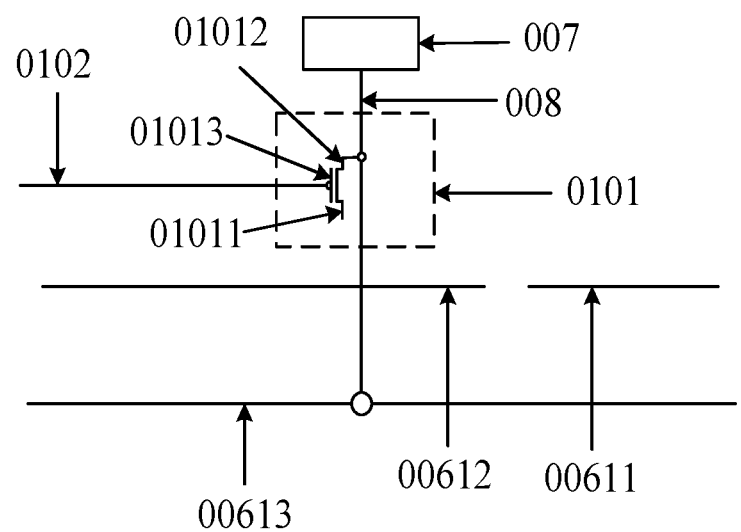
FIG. 9 is a schematic diagram of another first test dummy circuit according to an embodiment of the present disclosure.

FIG. 9 is a schematic diagram of another first test dummy circuit according to an embodiment of the present disclosure. Referring to FIG. 9, it can be seen that at least one of the first test dummy circuits 010 may include: a first dummy thin film transistor 0101 and a second control line 0102. The second control line 0102 is disposed in the peripheral region 001b and extended along the extension direction X of the first boundary 001a1.

The first dummy thin film transistor 0101 may include: a first dummy source 01011, a first dummy drain 01012, and a first dummy gate 01013. The first dummy gate 01013 may be electrically connected to the second control line 0102, wherein the second control line 0102 may provide a gate drive signal for the first dummy gate 01013. The first dummy drain 01012 may be electrically connected to one of the plurality of data transmission dummy lines 008.

In the embodiment of the present disclosure, the first control line 0092 may be electrically connected to the second control line 0102, that is, the first control line 0092 and the second control line 0102 may be the same control line. The gate drive signal provided by the first control line 0092 to the first gate 00913 of the first thin film transistor 0091 may be the same as the gate drive signal provided by the second control line 0102 to the first dummy gate 01013 of the first dummy thin film transistor 0101.

In the embodiment of the present disclosure, the number of the electrostatic discharge dummy circuits 007 may be the same as the number of the first test dummy circuits 010, and each electrostatic discharge dummy circuit 007 may be electrically connected to the third sub-trace 00613 by one first test dummy circuit 010.

Exemplarily, FIG. 5 shows two electrostatic discharge dummy circuits 007, which are disposed on two sides of the electrostatic discharge circuit 005 respectively. Each of the electrostatic discharge dummy circuits 007 may be electrically connected to the first test dummy circuit 010 on the same side.

Alternatively, the number of the electrostatic discharge dummy circuits 007 may be less than the number of the first test dummy circuits 010. For example, each electrostatic discharge dummy circuit 007 is electrically connected to one corresponding first test dummy circuit 010, and the first test dummy circuits 010 not electrically connected to the electrostatic discharge dummy circuits 007 are still independent circuits.

Alternatively, the number of the electrostatic discharge dummy circuits 007 may be greater than the number of the first test dummy circuits 010. For example, at least two of the plurality of electrostatic discharge dummy circuits 007 are electrically connected to the same first test dummy circuit 010.

Figure 10:
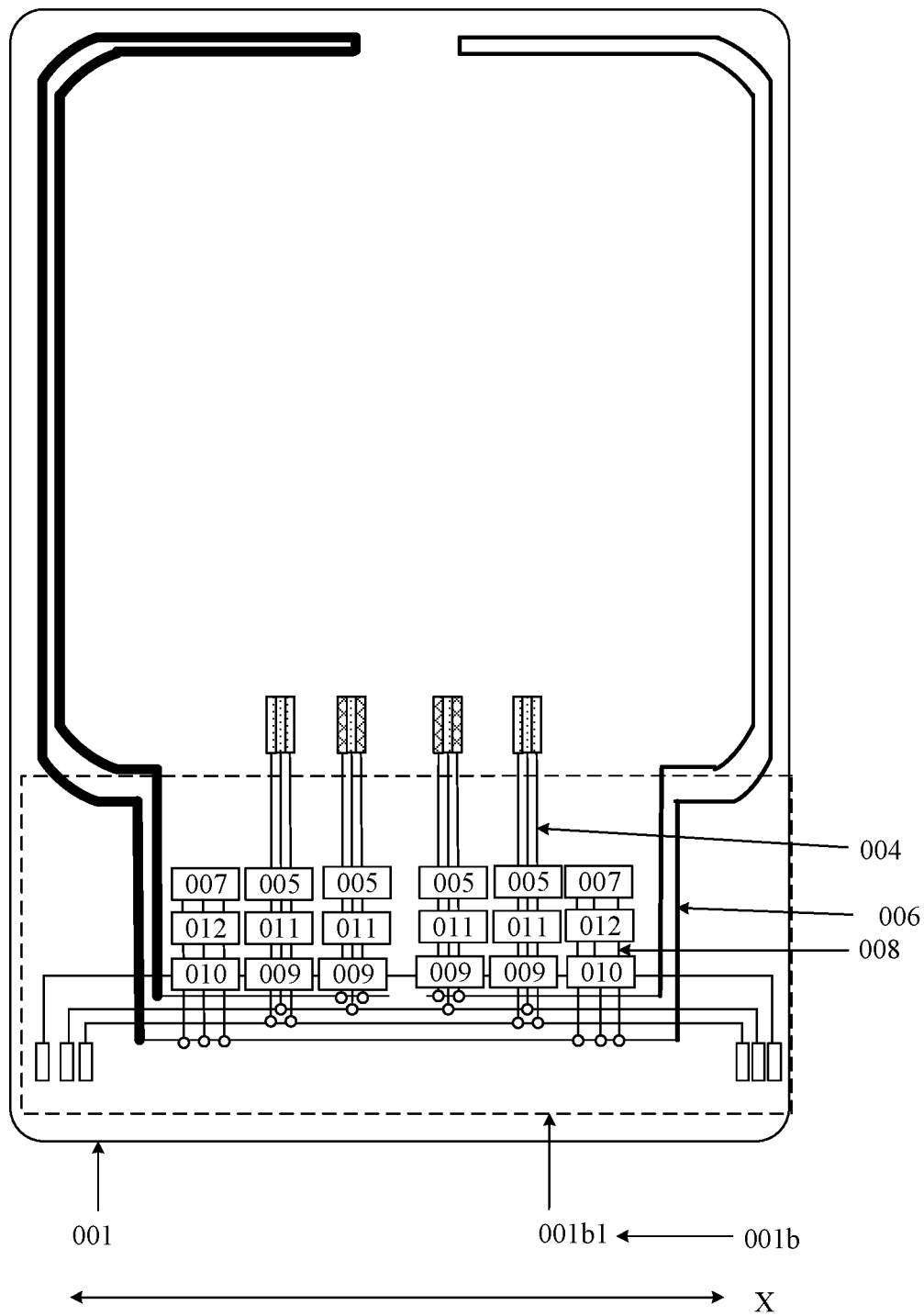
FIG. 10 is a structural schematic diagram of one additional display substrate according to an embodiment of the present disclosure.

FIG. 10 is a structural schematic diagram of one additional display substrate according to an embodiment of the present disclosure. Referring to FIG. 10, it can be seen that the display substrate 00 may further include: a plurality of second test circuits 011. The plurality of second test circuits 011 may be disposed between the plurality of electrostatic discharge circuits 005 and the plurality of first test circuits 009. In addition, the plurality of second test circuits 011 may be electrically connected to the plurality of electrostatic discharge circuits 005 and the plurality of first test circuits 009 by the plurality of data transmission lines 004.

Figure 11:
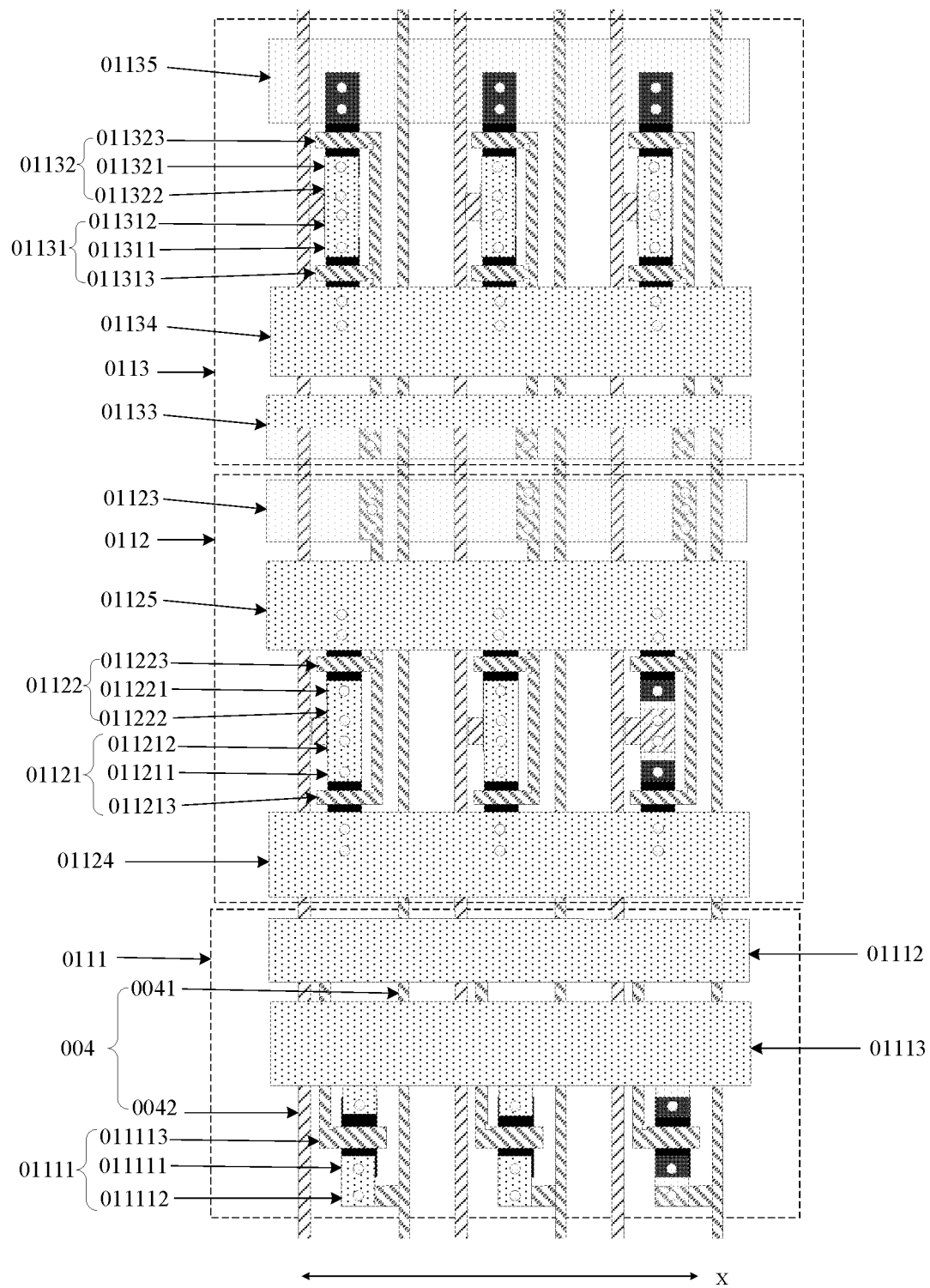
FIG. 11 is a structural schematic diagram of a second test circuit according to an embodiment of the present disclosure.

FIG. 11 is a schematic diagram of a second test circuit according to an embodiment of the present disclosure. Referring to FIG. 11, at least one of the plurality of second test circuits 011 may include: a first sub-circuit 0111, a second sub-circuit 0112, and a third sub-circuit 0113. Moreover, the second sub-circuit 0112 may be disposed between the first sub-circuit 0111 and the third sub-circuit 0113, the first sub-circuit 0111 is disposed on one side of the second sub-circuit 0112 distal from the plurality of sub-pixels 002, and the third sub-circuit 0113 is disposed on one side of the second sub-circuit 0112 proximal to the plurality of sub-pixels 002.

Referring to 11, the plurality of data transmission lines 004 may include: a plurality of first data transmission lines 0041 and a plurality of second data transmission lines 0042. The plurality of first data transmission lines 0041 and the plurality of second data transmission lines 0042 are arranged alternately one by one. For example, three first data transmission lines 0041 and three second data transmission lines 0042 are shown in FIG. 11. The first sub-circuit 0111 may include: a second thin film transistor 01111, a third control line 01112, and a third test data line 01113. The third control line 01112 and the third test data line 01113 may be extended along the extension direction X of the first boundary 001a1.

Figure 12:
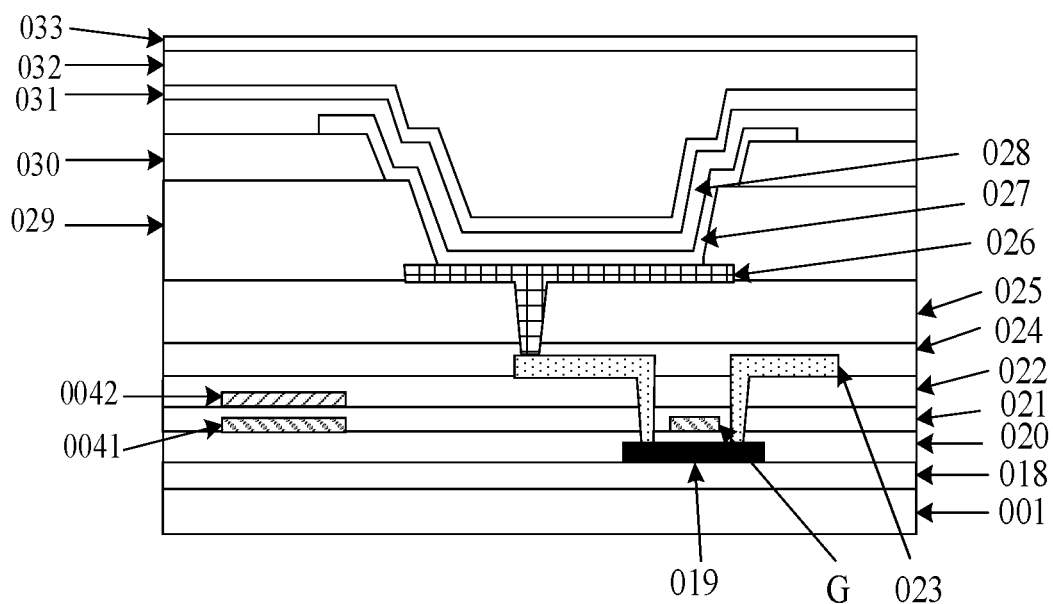
FIG. 12 is a cross-sectional view of a display substrate according to an embodiment of the present disclosure.

Referring to FIG. 12, the plurality of first data transmission lines 0041 may be disposed in the same layer as the first layer gate G in the thin film transistor, and the plurality of second data transmission lines 0042 may be disposed in the same layer as the second layer gate. That is, the first data transmission lines 0041 and the first layer gate G may be formed by one patterning process, and the second data transmission lines 0042 and the second layer gate may be formed by one patterning process.

Referring to FIG. 11, the second thin film transistor 01111 may include: a second source 011111, a second drain 011112, and a second gate 011113. The second source 011111 may be electrically connected to the third test data line 01113. The second drain 011112 may be electrically connected to one of the plurality of first data transmission lines 0041, and the second gate 011113 may be electrically connected to the third control line 01112. The third test data line 01113 may provide a data signal for the second source 011111, and the third control line 01112 may provide a gate drive signal for the second gate 011113.

Optionally, the first data transmission lines 0041 may be electrically connected to the data lines 003 for providing drive signals for the green sub-pixels 002 in the display region 001a.

Referring to FIG. 11, it can also be seen that the second sub-circuit 0112 may include: a third thin film transistor 01121, a fourth thin film transistor 01122, a fourth control line 01123, a fourth test data line 01124, and a fifth test data line 01125. The fourth control line 01123, the fourth test data line 01124, and the fifth test data line 01125 are extended along the extension direction X of the first boundary 001a1.

The third thin film transistor 01121 may include: a third source 011211, a third drain 011212, and a third gate 011213. The third source 011211 may be electrically connected to the fourth test data line 01124. The third drain 011212 may be electrically connected to one of the plurality of second data transmission lines 0042, and the third gate 011213 may be electrically connected to the fourth control line 01123. The fourth test data line 01124 may provide a data signal for the third source 011211, and the fourth control line 01123 may provide a gate drive signal for the third gate 011213.

The fourth thin film transistor 01122 may include a fourth source 011221, a fourth drain 011222, and a fourth gate 011223. The fourth source 011221 may be electrically connected to the fifth test data line 01125, the fourth drain 011222 may be electrically connected to one of the plurality of second data transmission lines 0042, and the fourth gate 011223 may be electrically connected to the fourth control line 01123. The fifth test data line 01125 may provide a data signal for the fourth source 011221, and the fourth control line 01123 may also provide a gate drive signal for the fourth gate 011223. That is, the third thin film transistor 01121 and the fourth thin film transistor 01122 may share one control line.

Optionally, the second data transmission lines 0042 may be electrically connected to the data lines 003 providing drive signals for the red sub-pixels 002 or the blue sub-pixels 002 in the display region 001a.

Referring to FIG. 11, the third sub-circuit 0113 may include: a fifth thin film transistor 01131, a sixth thin film transistor 01132, a fifth control line 01133, a sixth test data line 01134, and a seventh test data line 01135. The fifth control line 01133, the sixth test data line 01134 and the seventh test data line 01135 may be extended along the extension direction X of the first boundary 001a1.

The fifth thin film transistor 01131 may include: a fifth source 011311, a fifth drain 011312, and a fifth gate 011313. The fifth source 011311 may be electrically connected to the sixth test data line 01134, the fifth drain 011312 may be electrically connected to one of the plurality of second data transmission lines 0042, and the fifth gate 011313 may be electrically connected to the fifth control line 01133. The sixth test data line 01134 may provide a data signal for the fifth source 011311, and the fifth control line 01133 may provide a gate drive signal for the fifth gate 011313.

The sixth thin film transistor 01132 may include: a sixth source 011321, a sixth drain 011322, and a sixth gate 011323. The sixth source 011321 may be electrically connected to the seventh test data line 01135, the sixth drain 011322 may be electrically connected to one of the plurality of second data transmission lines 0042, and the sixth gate 011323 may be electrically connected to the fifth control line 01133. The seventh test data line 01135 may provide a data signal for the sixth source 011321, and the fifth control line 01133 may also provide a gate drive signal for the sixth gate 011323. That is, the fifth thin film transistor 01131 and the sixth thin film transistor 01132 may share one control line.

In the embodiment of the present disclosure, referring to FIG. 11, the fourth control line 01123 and the fifth control line 01133 are arranged adjacently, and the fourth control line 01123 and the fifth control line 01133 may be one control line. Thus, the third thin film transistor 01121, the fourth thin film transistor 01122, the fifth thin film transistor 01131, and the sixth thin film transistor 01132 may share one control line.

Referring to FIG. 10, it can also be seen that the display substrate 00 may further include: a plurality of second test dummy circuits 012. The plurality of second test dummy circuits 012 are disposed on two sides of the plurality of second test circuits 011 and disposed between the plurality of electrostatic discharge dummy circuits 007 and the plurality of first test dummy circuits 010 along the extension direction X of the first boundary 001a1. The plurality of second test dummy circuits 012 may be electrically connected to the first test dummy circuits 010 and the electrostatic discharge dummy circuits 007 by the plurality of data transmission dummy lines 008.

Figure 13:
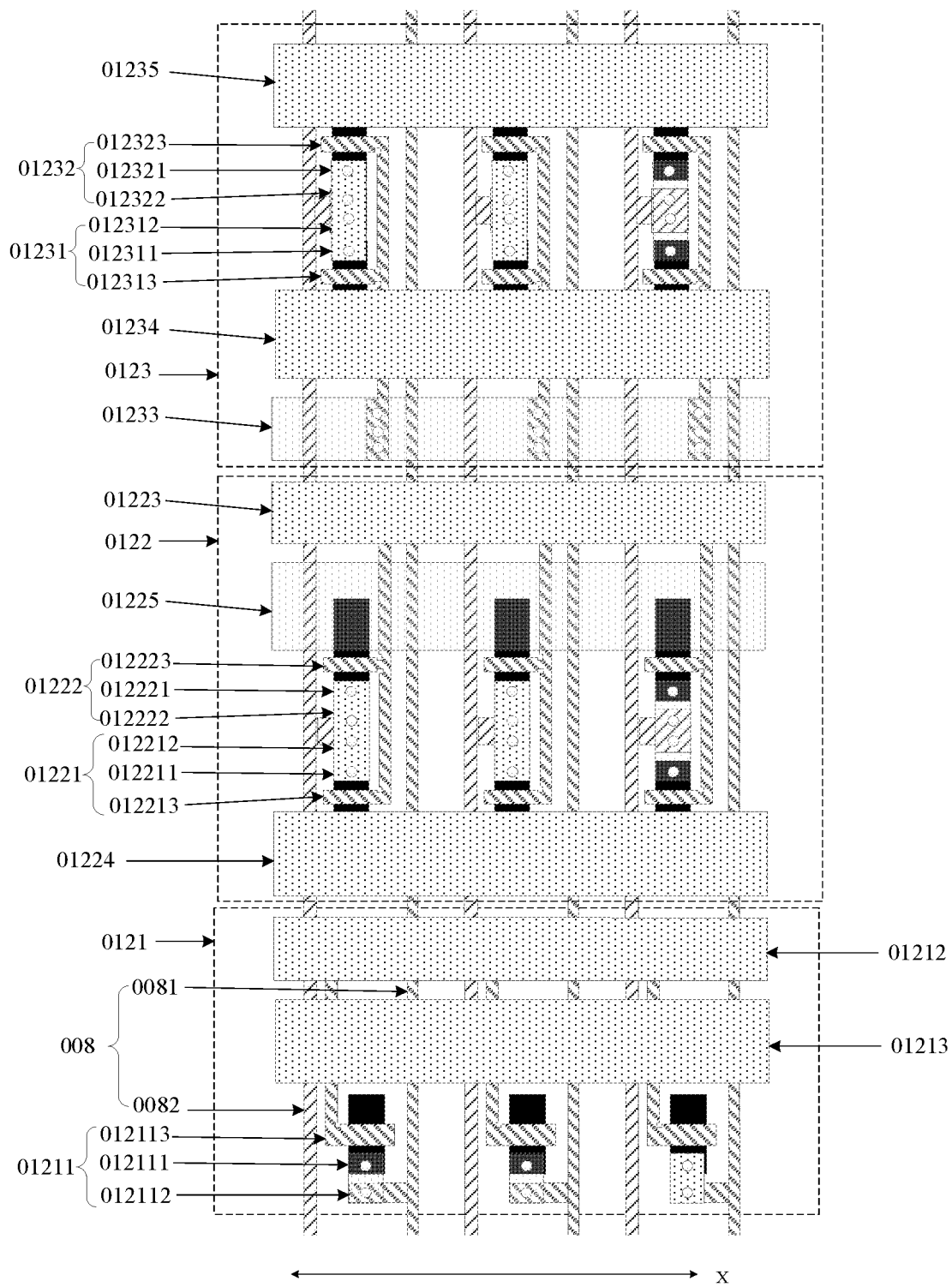
FIG. 13 is a structural schematic diagram of a second test dummy circuit according to an embodiment of the present disclosure.

FIG. 13 is a schematic diagram of a second test dummy circuit according to an embodiment of the present disclosure. Referring to FIG. 13, at least one of the plurality of second test dummy circuits 012 may include: a first dummy sub-circuit 0121, a second dummy sub-circuit 0122, and a third dummy sub-circuit 0123. The second dummy sub-circuit 0122 may be disposed between the first dummy sub-circuit 0121 and the third dummy sub-circuit 0123, the first dummy sub-circuit 0121 is disposed on one side of the second dummy sub-circuit 0122 distal from the plurality of sub-pixels 002, and the third dummy sub-circuit 0123 is disposed on one side of the second dummy sub-circuit 0122 proximal to the plurality of sub-pixels 002.

Referring to FIG. 13, the plurality of data transmission dummy lines 008 may include: a plurality of first data transmission dummy lines 0081 and a plurality of second data transmission dummy lines 0082. The plurality of first data transmission dummy lines 0081 and the plurality of second data transmission dummy lines 0082 are alternately arranged one by one. The first dummy sub-circuit 0121 may include: a second dummy thin film transistor 01211, a sixth control line 01212, and an eighth test data line 01213. The sixth control line 01212 and the eighth test data line 01213 may be extended along the extension direction X of the first boundary 001a1.

Referring to FIG. 13, the second dummy thin film transistor 01211 may include: a second dummy source 012111, a second dummy drain 012112, and a second dummy gate 012113. The second dummy drain 012112 is electrically connected to one of the plurality of first data transmission dummy lines 0081, and the second dummy gate 012113 may be electrically connected to the sixth control line 01212. That is, the sixth control line 01212 may provide a gate drive signal for the second dummy gate 012113.

In the embodiment of the present disclosure, the first data transmission dummy line 0081 is not connected to the data line 003 in the display region 001a, but is connected to the third sub-trace 00613.

Referring to FIG. 13, the second dummy sub-circuit 0122 may include: a third dummy thin film transistor 01221, a fourth dummy thin film transistor 01222, a seventh control line 01223, a ninth test data line 01224, and a tenth test data line 01225. The seventh control line 01223, the ninth test data line 01224, and the tenth test data line 01225 are extended along the extension direction X of the first boundary 001a1.

The third dummy thin film transistor 01221 may include: a third dummy source 012211, a third dummy drain 012212, and a third dummy gate 012213. The third dummy drain 012212 is electrically connected to one of the plurality of second data transmission dummy lines 0082, and the third dummy gate 012213 is electrically connected to the seventh control line 01223. The seventh control line 01223 may provide a gate drive signal for the third dummy gate 012213.

The fourth dummy thin film transistor 01222 may include: a fourth dummy source 012221, a fourth dummy drain 012222, and a fourth dummy gate 012223. The fourth dummy drain 012222 may be electrically connected to one of the plurality of second data transmission dummy lines 0082, and the fourth dummy gate 012223 may be electrically connected to the seventh control line 01223. The seventh control line 01223 may provide a gate drive signal for the fourth dummy gate 012223. That is, the third dummy thin film transistor 01221 and the fourth dummy thin film transistor 01222 may share one control line.

In the embodiment of the present disclosure, the second data transmission dummy line 0082 is not connected to the data line 003 in the display region 001a, but is connected to the third sub-trace 00613.

Referring to FIG. 13, it can also be seen that the third dummy sub-circuit 0123 includes: a fifth dummy thin film transistor 01231, a sixth dummy thin film transistor 01232, an eighth control line 01233, an eleventh test data line 01234, and a twelfth test data line 01235. The eighth control line 01233, the eleventh test data line 003 and the twelfth test data line 01235 are extended along the extension direction X of the first boundary 001a1.

The fifth dummy thin film transistor 01231 may include: a fifth dummy source 012311, a fifth dummy drain 012312, and a fifth dummy gate 012313. The fifth dummy drain 012312 may be electrically connected to one of the plurality of second data transmission dummy lines 0082. The fifth dummy gate 012313 may be electrically connected to the eighth control line 01233. The eighth control line 01233 may provide a gate drive signal for the fifth dummy gate 012313.

The sixth dummy thin film transistor 01232 may include: a sixth dummy source 012321, a sixth dummy drain 012322, and a sixth dummy gate 012323. The sixth dummy drain 012322 may be electrically connected to one of the plurality of second data transmission dummy lines 0082. The sixth dummy gate 012323 may be electrically connected to the eighth control line 01233. That is, the fifth dummy thin film transistor 01231 and the sixth dummy thin film transistor 01232 may share one control line.

In the embodiment of the present disclosure, referring to FIG. 13, the seventh control line 01223 and the eighth control line 01233 are disposed adjacent to each other, and the seventh control line 01223 and the eighth control line 01233 may be one control line. Thus, the third thin film dummy transistor 01221, the fourth dummy thin film transistor 01222, the fifth dummy thin film transistor 01231, and the sixth dummy thin film transistor 01232 may share one control line.

It should be noted that the third control line 01112 may be electrically connected to the sixth control line 01212, that is, the third control line 01112 and the sixth control line 01212 may be the same control line. The gate drive signal provided by the third control line 01112 to the second gate 011113 of the second thin film transistor 01111 may be the same as the drive signal provided by the sixth control line 01212 to the second dummy gate 012113 of the second dummy thin film transistor 01211.

The fourth control line 01123 may be electrically connected to the seventh control line 01223, that is, the fourth control line 01123 and the seventh control line 01223 may be the same control line. The gate drive signal provided by the fourth control line 01123 to the third gate 011213 of the third thin film transistor 01121 and the fourth gate 011223 of the fourth thin film transistor 01122 may the same as the gate drive signal provided by the seventh control line 01223 to the third dummy gate 012213 of the third dummy thin film transistor 01221 and the fourth dummy gate 012223 of the fourth dummy thin film transistor 01222.

The fifth control line 01133 may be electrically connected to the eighth control line 01233, that is, the fifth control line 01133 and the eighth control line 01233 may be the same control line. The gate drive signal provided by the fifth control line 01133 to the fifth gate 011313 of the fifth thin film transistor 01131 and the sixth gate 011323 of the sixth thin film transistor 01132 may be the same as the gate drive signal provided by the eighth control line 01233 to the fifth dummy gate 012313 of the fifth dummy thin film transistor 01231 and the sixth dummy gate 012323 of the sixth dummy thin film transistor 01232.

The third test data line 01113 may be electrically connected to the eighth test data line 01213, that is, the third test data line 01113 and the eighth test data line 01213 may be the same data line. The third test data line 01113 and the eighth test data line 01213 may provide data signals to the second source 011111 of the second thin film transistor 01111.

The fourth test data line 01124 may be electrically connected to the ninth test data line 01224, that is, the fourth test data line 01124 and the ninth test data line 01224 may be the same data line. The fourth test data line 01124 and the ninth test data line 01224 may provide data signals for the third source 011211 of the third thin film transistor 01121.

The fifth test data line 01125 may be electrically connected to the tenth test data line 01225, that is, the fifth test data line 01125 and the tenth test data line 01225 may be the same data line. The fifth test data line 01125 and the tenth test data line 01225 may provide data signals to the fourth source 011221 of the fourth thin film transistor 01122.

The sixth test data line 01134 may be electrically connected to the eleventh test data line 01234, that is, the sixth test data line 01134 and the eleventh test data line 01234 may be the same data line. The sixth test data line 01134 and the eleventh test data line 01234 may provide data signals for the fifth gate 011313 of the fifth thin film transistor 01131.

The seventh test data line 01135 may be electrically connected to the twelfth test data line 01235, that is, the seventh test data line 01135 and the twelfth test data line 01235 may be the same data line. The seventh test data line 01135 and the twelfth test data line 01235 may provide data signals for the sixth source 011321 of the sixth thin film transistor 01132.

It should be noted that during the manufacturing process of the display substrate 00, the second test circuit 011 needs to be manufactured between the electrostatic discharge circuit 005 and the first test circuit 009 in the peripheral region 001b of the base substrate 001. The second test circuit 011 may be configured to connect the electrostatic discharge circuit 005 and the first test circuit 009. When the second test circuit 011 is manufactured, in order to ensure the manufacturing accuracy of the second test circuit 011, a test circuit not electrically connected to the electrostatic discharge circuit 005 and the first test circuit 009, that is, a second test dummy circuit 012, can be manufactured on the base substrate 001. In the embodiment of the present disclosure, the electrostatic discharge dummy circuit 007 disposed in the display substrate may be connected to the panel crack detection trace 006 by the second test dummy circuit 012 and the first test dummy circuit 010, thereby optimizing the traces and the circuit arrangement of the back plate.

In the embodiment of the present disclosure, the number of the second test dummy circuits 012 may be the same as the number of the electrostatic discharge dummy circuits 007 and the number of the first test dummy circuits 010. Each electrostatic discharge dummy circuit 007 may be electrically connected to one first test dummy circuit 010 by one second test dummy circuit 012.

Exemplarily, FIG. 10 shows two second test dummy circuits 012. The two second test dummy circuits 012 may be disposed on two sides of the plurality of second test circuits 011. For each second test dummy circuit 012, the second test dummy circuit 012 may be electrically connected to the electrostatic discharge dummy circuit 007 and the first test dummy circuit 010 disposed at the same side thereof.

Figure 14:
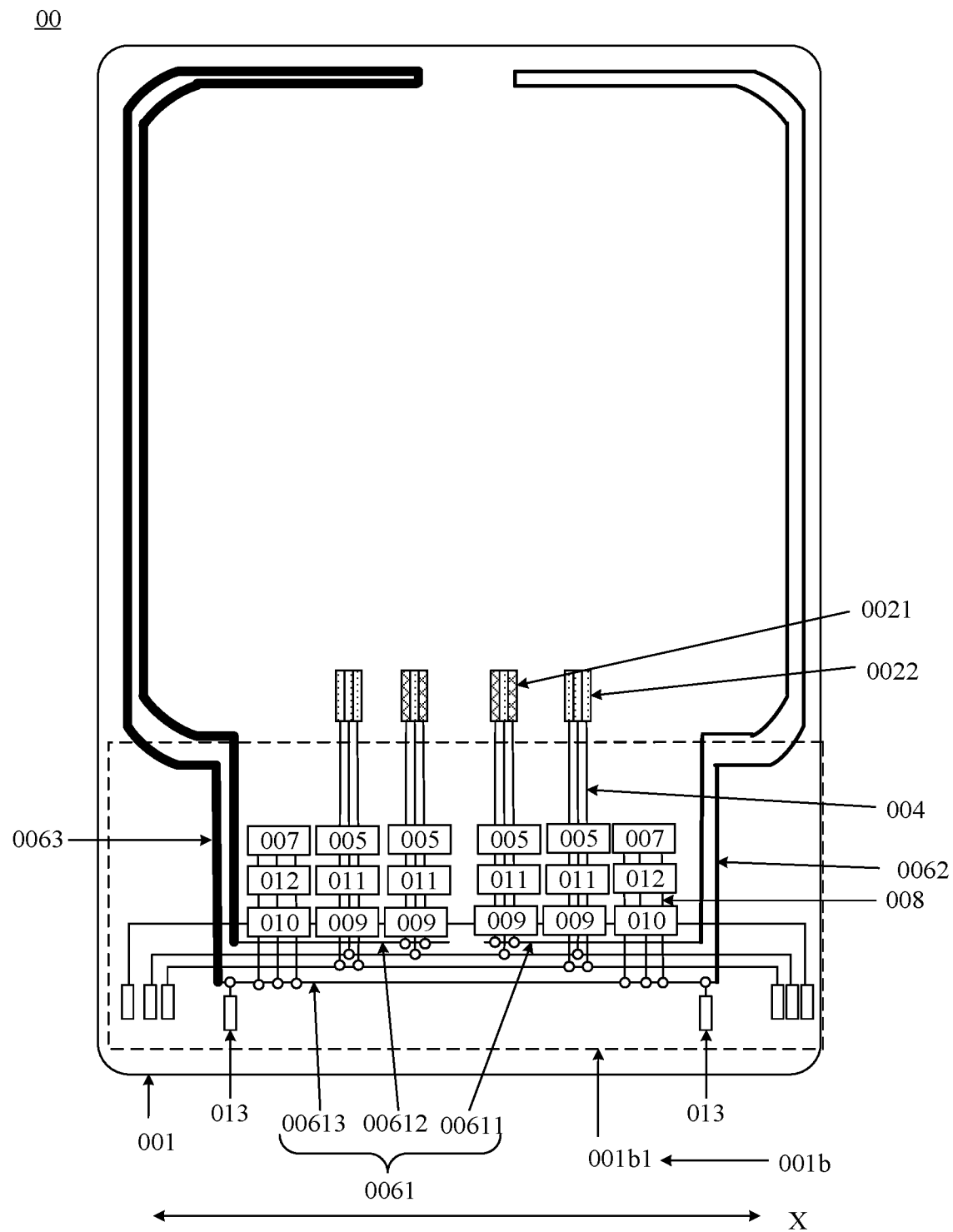
FIG. 14 is a structural schematic diagram of one more display substrate according to an embodiment of the present disclosure.

FIG. 14 is a structural schematic diagram of one more display substrate according to an embodiment of the present disclosure. Referring to FIG. 14, it can be seen that the display substrate 00 may further include: at least one first signal input terminal 013. The at least one first signal input terminal 013 may be connected to the third sub-trace 00613, and the at least one first signal input terminal 013 may be configured to receive a test signal to detect the display substrate.

Optionally, the at least one first signal input terminal 013 may include: two first signal input terminals 013. The two first signal input terminals 013 may be respectively disposed on two sides of the first test circuit 009.

Referring to FIG. 14, it can be seen that the plurality of sub-pixels 002 may include: at least one column of first sub-pixels 0021. In FIG. 14, only part of the sub-pixels 002 in each column of the sub-pixels 002 are schematically shown. The first sub-pixels 0021 may be connected to the first sub-trace 00611 or the second sub-trace 00612. The at least one first signal input terminal 013 may be configured to provide a drive signal to the first sub-pixels 0021. The drive signal may be configured to drive each column of the first sub-pixels 0021 to emit the light of a target color. The drive signal may be a cell test data (CTD) signal.

The third sub-trace 00613 is connected to the second trace segment 0062 and the third trace segment 0063, the second trace segment 0062 is connected to the first sub-trace 00611, and the third trace segment 0063 is connected to the second sub-trace 00612. The first sub-trace 00611 may be connected to the first sub-pixels 0021, and the second sub-trace 00612 may be connected to the first sub-pixels 0021. Therefore, the first signal input terminal 013 inputs a drive signal to the third sub-trace 00613, and the third sub-trace 00613 may transmit the drive signal to the second trace segment 0062 and the third trace segment 0063. The second trace segment 0062 may transmit the drive signal to the first sub-trace 00611, and the third trace segment 0063 may transmit the drive signal to the second sub-trace 00612. Finally, the first sub-trace 00611 may transmit the drive signal to the first sub-pixels 0021 connected to the first sub-trace 00611, and the second sub-trace 00612 may transmit the drive signal to the first sub-pixels 0021 connected to the second sub-trace 00612.

That is, the drive signal needs to be transmitted to the first sub-pixels 0021 connected to the first sub-trace 00611 through the third sub-trace 00613, the second trace segment 0062, and the first sub-trace 00611 in sequence. If there is a crack in the edge of the area where the third sub-trace 00613, the second trace segment 0062, and the first sub-trace 00611 are disposed in the display substrate, that is, the third sub-trace 00613, the second trace segment 0062, or the first sub-trace 00611 is broken, the drive signal cannot be transmitted to the first sub-pixels 0021 connected to the first sub-trace 00611, and the first sub-pixels 0021 cannot emit the light of a target color. If there is no crack in the edge of the area where the third sub-trace 00613, the second trace segment 0062, and the first sub-trace 00611 in the display substrate 00 are disposed, that is, the third sub-trace 00613, the second trace segment 0062, and the first sub-trace 00611 are not broken, the drive signal can be transmitted to the first sub-pixels 0021 connected to the first sub-trace 00611, and the first sub-pixels 0021 can emit the light of a target color.

In addition, the drive signal needs be transmitted to the first sub-pixels 0021 connected to the second sub-trace 00612 through the third sub-trace 00613, the third trace segment 0063, and the second sub-trace 00612 in sequence. If there is a crack in the edge of the area where the third sub-trace 00613, the third trace segment 0063, and the second sub-trace 00612 are disposed in the display substrate, that is, the third sub-trace 00613, the third trace segment 0063, or the second sub-trace 00612 is broken, the drive signal cannot be transmitted to the first sub-pixels 0021 connected to the second sub-trace 00612, and the first sub-pixels 0021 cannot emit the light of a target color. If there is no crack in the edge of the area where the third sub-trace 00613, the third trace segment 0063, and the second sub-trace 00612 are disposed in the display substrate, that is, the third sub-trace 00613, the third trace segment 0063, and the second sub-trace 00612 are not broken, the drive signal can be transmitted to the first sub-pixels 0021 connected to the second sub-trace 00612, and the first sub-pixels 0021 can emit the light of a target color.

Optionally, the target color may be black, and the first sub-pixel 0021 may be a green sub-pixel 002. If there is a crack in the edge of the display substrate 00, the green sub-pixel 002 cannot receive a drive signal, and the green sub-pixels 002 may emit green light.

Thus, it can be determined whether there is a crack in the edge of the display substrate by determining whether the first sub-pixels 0021 emit the light of the target color. That is, if each column of the first sub-pixels 0021 may emit the light of a target color, it can be determined that the first sub-pixels 0021 can receive the drive signal, and then it can be determined that there is no crack in the edge of the display substrate 00. If a certain column of the first sub-pixels 0021 cannot emit the light of a target color, it can be determined that such column of the first sub-pixels 0021 cannot receive the drive signal, and then it can be determined that there is a crack in the edge of the display substrate 00.

It should be noted that if there is a crack in the edge of the display substrate 00 and the crack is smaller, which will not cause a crack in the panel crack detection trace 006, and the first sub-pixels 0021 can emit the light of a target color.

Figure 15:
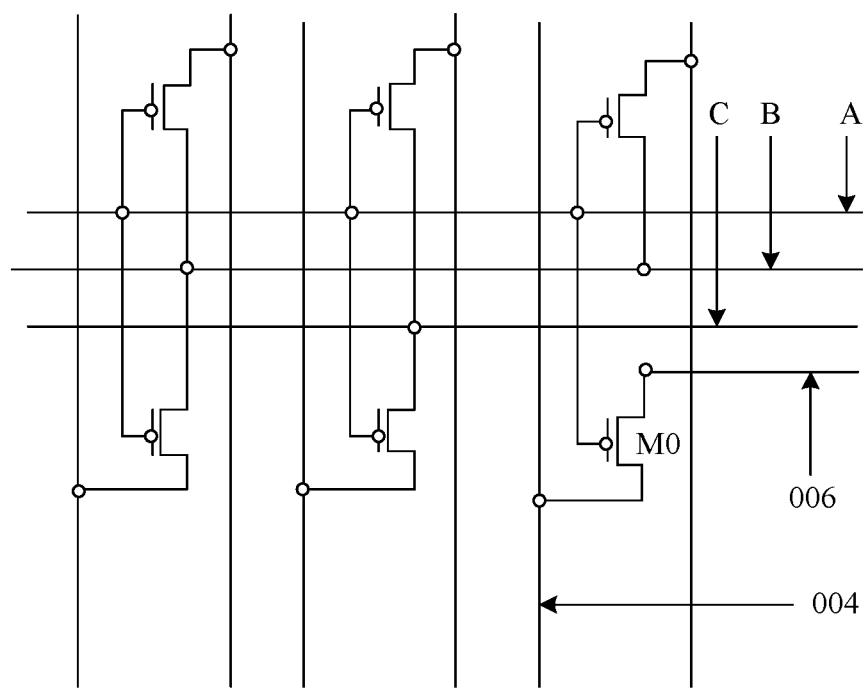
FIG. 15 is a circuit diagram of a detection panel crack detection trace according to an embodiment of the present disclosure.

FIG. 15 is a detection schematic diagram of a panel crack detection trace according to an embodiment of the present disclosure. Referring to FIG. 15, it can be seen that the panel crack detection trace 006 may be connected to a source of a target transistor M0, a gate of the target transistor M0 may be connected to a gate line A, and a drain of the target transistor M0 may be connected to the first sub-pixel 0021 by the data transmission line 004 and the data line 003.

The current I flowing in the target transistor M0 may satisfy:

$$I=K(Vgs-Vth)^2=K[(Vdata+Vth-Vs)-Vth]^2=K(Vdata-Vs)^2$$

wherein K is a constant determined by characteristics of the target transistor M0, and satisfies:

$$K = \frac{1}{2}\mu\left(\frac{\varepsilon}{d} \times \frac{W}{L}\right),$$

wherein μ is a carrier mobility of the target transistor M0, W/L is a channel aspect ratio of the target transistor M0, ε is the dielectric constant of a gate oxide layer of the target transistor M0, and d is a thickness of the gate oxide layer.

In addition, Vgs is a voltage difference between the gate and source of the target transistor M0, Vth is a threshold voltage of the target transistor M0, Vdata is a voltage on the data transmission line 004, and Vs is a source voltage of the target transistor M0.

If the panel crack detection trace 006 is not broken, the source voltage of the target transistor M0 provided by the panel crack detection trace 006 is the same as the source voltage provided by a first target drive line B and a second target drive line C to other transistors, for example, the source voltage may be 6 volts (V).

If the panel crack detection trace 006 is broken, the voltage of the target transistor M0 provided by the panel crack detection trace 006 is 0V, and the voltage provided by the gate line to the target transistor M0 is −7V, then Vgs=Vg−Vs=−7V<Vth. Vdata=0, I=K(Vs)². Thus, the green sub-pixel 002 connected to the target transistor M0 will be lightened, that is, a green bright line appears on the black screen.

Figure 16:
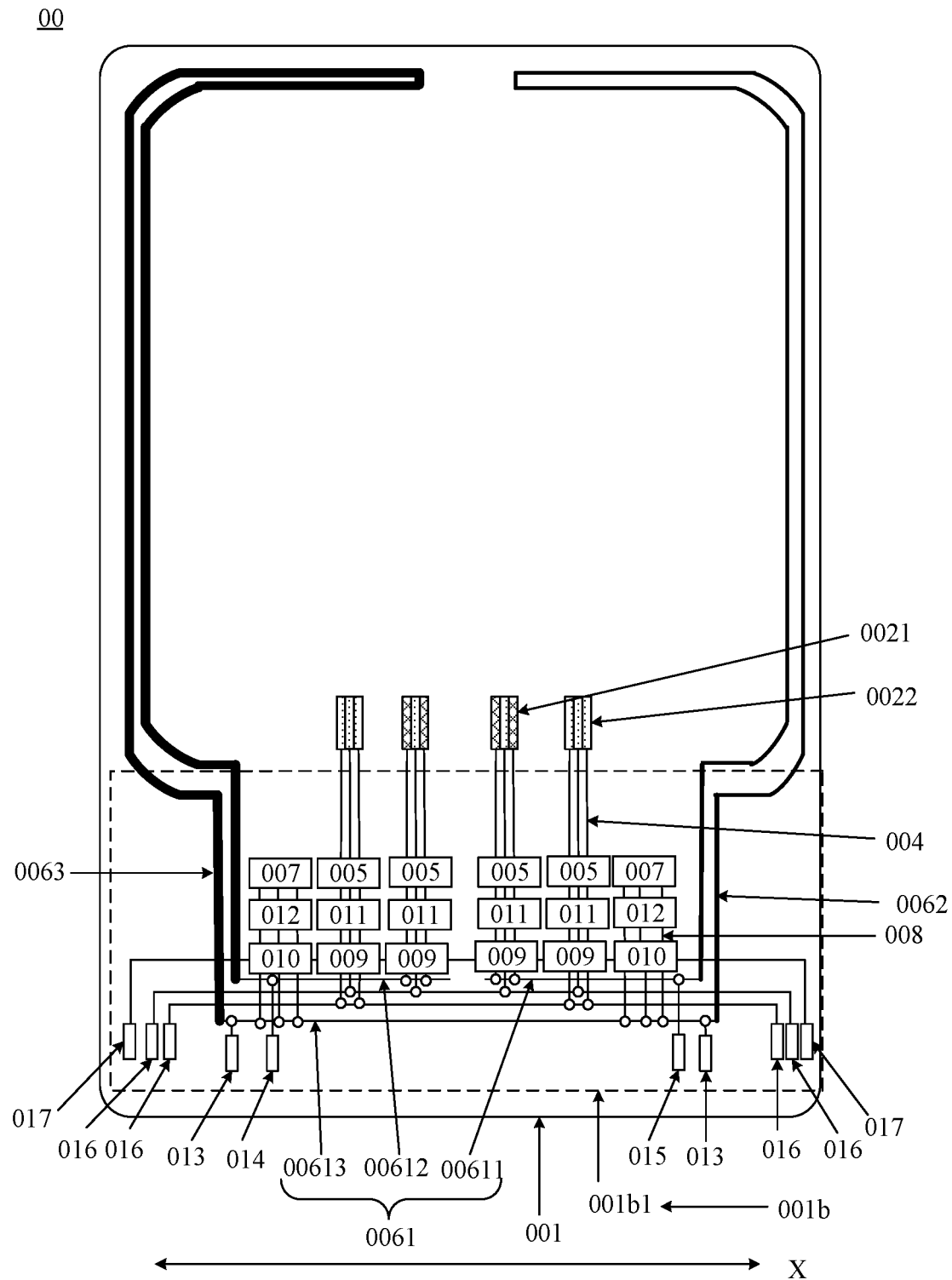
FIG. 16 is a structural schematic diagram of one additional display substrate according to an embodiment of the present disclosure.

FIG. 16 is a structural schematic diagram of one additional display substrate according to an embodiment of the present disclosure. Referring to FIG. 16, it can be seen that the display substrate 00 may further include: a first detection terminal 014 and a second detection terminal 015. The first detection terminal 014 may be connected to the first sub-trace 00611 for providing a detection signal for the first sub-trace 00611. The second detection terminal 015 may be connected to the second sub-trace 00612 for receiving the detection signal to detect the display substrate.

If the second detection terminal 015 may receive the detection signal, it can be determined that the panel crack detection trace 006 is not broken, that is, there is no crack in the edge of the display substrate 00. If the second detection terminal 015 cannot receive the detection signal, it can be determined that the panel crack detection trace 006 is broken, that is, there is a crack in the edge of the display substrate 00.

In the embodiment of the present disclosure, referring to FIG. 14 and FIG. 16, the plurality of sub-pixels 002 may further include: a plurality of columns of second sub-pixels 0022 except at least one column of first sub-pixels 0021. The display substrate 00 may further include: at least one second signal input terminal 016 and at least one third signal input terminal 017. The second signal input terminal 016 may be connected to at least one column of the second sub-pixels 0022, and is configured to provide a drive signal to each column of second sub-pixels 0022 connected thereto, and the drive signal is configured to drive each column of the second sub-pixels 0022 to emit the light of a target color. The third signal input terminal 017 may be electrically connected to the first test circuit 009 and the first test dummy circuit 010.

Since the second sub-pixel 0022 is directly electrically connected to the second signal input terminal 016, the drive signal may be directly input to the second sub-pixel 0022. That is, regardless of whether there is a crack in the edge of the display substrate 00, the second sub-pixel 0022 can emit the light of a target color.

In the embodiment of the present disclosure, the second signal input terminal 016 may be electrically connected to the first test data line 0093 or the second test data line 0094. The second sub-pixel 0022 may be a red sub-pixel 002 or a blue sub-pixel 002.

Optionally, the at least one second signal input terminal 016 may include: four second signal input terminals 016. The four second signal input terminals 016 may be disposed on two sides of the first test circuit 009 respectively. Each side of the first test circuit 009 may be provided with two second signal input terminals 016, wherein one of the second signal input terminals 016 is electrically connected to the first test data line 0093, and the other second signal input terminal 016 is electrically connected to the second test data line 0094.

Figure 17:
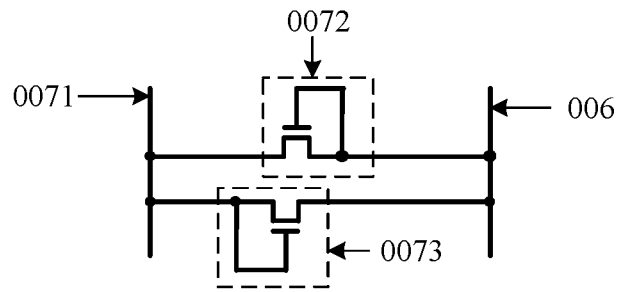
FIG. 17 is a circuit diagram of an electrostatic discharge dummy circuit according to an embodiment of the present disclosure.

FIG. 17 is a circuit diagram of an electrostatic discharge dummy circuit according to an embodiment of the present disclosure. Referring to FIG. 17, it can be seen that the electrostatic discharge dummy circuit 007 may include: a first electrostatic protection line 0071, at least one first discharge transistor 072, and at least one second discharge transistor 0073. A first electrode and a gate of the at least one first discharge transistor 072 are both connected to the panel crack detection trace 006, and a second electrode of the at least one first discharge transistor 0072 may be connected to the first electrostatic protection line 0071. A first electrode and a gate of the at least one second discharge transistor 0073 may be connected to the first electrostatic protection line 0071, and a second electrode of the at least one second discharge transistor 0073 may be connected to the panel crack detection trace 006.

If the static electricity accumulated on the panel crack detection trace 006 is negative charges, the first discharge transistor 0072 is turned on to conduct the panel crack detection trace 006 and the first electrostatic protection line 0071, and the panel crack detection trace 006 may discharge to the first electrostatic protection line 0071 through the first discharge transistor 0072. That is, the negative charges accumulated on the panel crack detection trace 006 may be discharged to the first electrostatic protection line 0071 through the first discharge transistor 0072.

If the static electricity accumulated on the panel crack detection trace 006 is positive charges, the second discharge transistor 0073 is turned on to conduct the panel crack detection trace 006 and the first electrostatic protection line 0071, and the panel crack detection trace 006 may discharge to the first electrostatic protection line 0071 through the second discharge transistor 0073. That is, the positive charges accumulated on the panel crack detection trace 006 may be discharged to the first electrostatic protection line 0071 through the second discharge transistor 0073.

Figure 18:
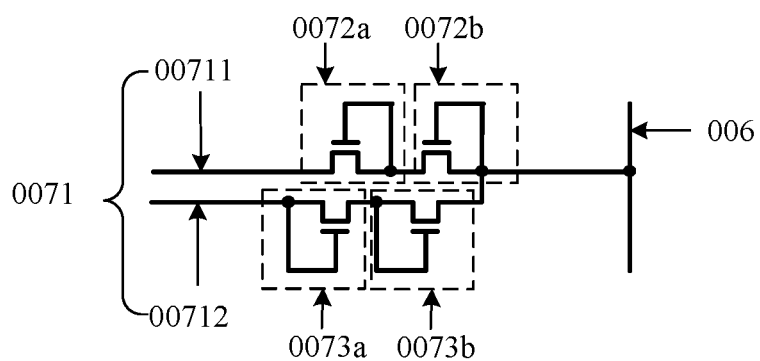
FIG. 18 is a circuit diagram of another electrostatic discharge dummy circuit according to an embodiment of the present disclosure.

In the embodiment of the present disclosure, referring to FIG. 18, the first electrostatic protection line 0071 may include a first discharge line 00711 and a second discharge line 00712. In addition, the electrostatic discharge dummy circuit 007 may include: two first discharge transistors 0072 and two second discharge transistors 0073.

Referring to FIG. 18, a first electrode and a gate of a first of the first discharge transistor 0072a are both connected to the panel crack detection trace 006, and a second electrode of the first of the first discharge transistor 0072a is connected to a first electrode and a gate of a second of the first discharge transistor 0072b, and a second electrode of the second of the first discharge transistor 0072b is connected to the first discharge line 00711. That is, the first electrode and the gate of the second of the first discharge transistor 0072b may be connected to the first discharge line 00711 by the first of the first discharge transistor 0072a.

A first electrode and a gate of a first of the second discharge transistor 0073 are both connected to the second discharge line 00712, and a second electrode of the first of the second discharge transistor 0073 is connected to a first electrode and a gate electrode of a second of the second discharge transistor 0073. A second electrode of the second of the second discharge transistor 0073 is connected to the panel crack detection trace 006. That is, the first electrode and the gate of the second of the second discharge transistor 0073 may be connected to the second discharge line 00712 by the first of the second discharge transistor 0073.

The first discharge line 00711 may be a voltage gate low (VGL) line. The second discharge line 00712 may be a voltage gate high (VGH) line.

Figure 19:
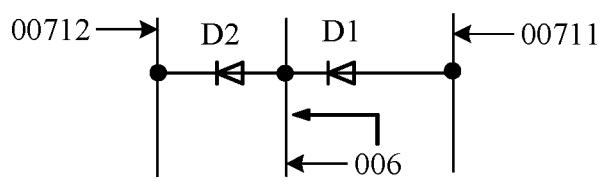
FIG. 19 is a schematic diagram that an electrostatic discharge dummy circuit discharges negative charges according to an embodiment of the present disclosure.

FIG. 19 is a schematic diagram that the electrostatic discharge dummy circuit discharges negative charges according to an embodiment of the present disclosure. In FIG. 19, the at least one first discharge transistor 0072 is equivalent to a diode D1, and the at least one second discharge transistor 0073 is also equivalent to a diode D2. Referring to FIG. 19, when no negative charges are accumulated on the panel crack detection trace 006, a gate potential Vg1 of the first discharge transistor 0072 and a source (that is, the first electrode) potential Vs1 of the first discharge transistor 0072 are both equal to a potential Vpcd of the panel crack detection trace 006, and the potential Vpcd is greater than the potential VGL on the first discharge line 00711. A drain (that is, the second electrode) potential Vd1 of each first discharge transistor 0072 is equal to the potential VGL on the first discharge line 00711. That is, when no negative charges are accumulated on the panel crack detection trace 006, Vg1=Vs1=Vpcd>VGL, Vd1=VGL.

When the negative charges are accumulated on the panel crack detection trace 006, the gate potential Vg1 of each first discharge transistor 0072 and the source potential Vs1 of each first discharge transistor 0072 are equal to the potential Vpcd of the panel crack detection trace 006, and the potential Vpcd is less than the potential VGL on the first discharge line 00711. The drain potential Vs1 of each first discharge transistor 0072 is equal to the potential VGL on the first discharge line 00711. That is, when the negative charges are accumulated on the panel crack detection trace 006, Vg1=Vs1=Vpcd<VGL, Vd1=VGL. At this time, each first discharge transistor 0072 is turned on (that is, the diode D1 is ON), and the negative charges in the panel crack detection trace 006 may be discharged to the first discharge line 00711.

Exemplarily, assuming that the potential VGL on the first discharge line 00711 is −7V, and when no negative charges are accumulated on the panel crack detection trace 006, that is, the potential Vpcd of the panel crack detection trace 006 is 0V (the gate potential and the source potential of the first discharge transistor 0072 are both 0V), that is, greater than −7V. The drain potential Vd1 of the first discharge transistor 0072 is equal to −7V. At this time, the first discharge transistor 0072 is turned off.

When the negative charges are accumulated on the panel crack detection trace 006, the potential on the panel crack detection trace 006 is less than −7V, and the drain potential Vd1 of the first discharge transistor 0072 is equal to −7V. At this time, the first discharge transistor 0072 is ON.

Figure 20:
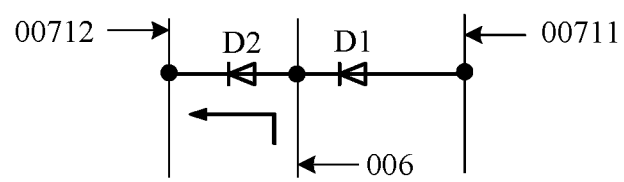
FIG. 20 is a schematic diagram that an electrostatic discharge dummy circuit discharges positive charges according to an embodiment of the present disclosure.

FIG. 20 is a schematic diagram that the electrostatic discharge dummy circuit discharges positive charges according to an embodiment of the present disclosure. In FIG. 20, the at least one first discharge transistor 072 is equivalent to a diode D1, and the at least one second discharge transistor 0073 is also equivalent to a diode D2. Referring to FIG. 20, when no positive charges are accumulated on the panel crack detection trace 006, a gate potential Vg2 of each second discharge transistor 0073 and a source (first electrode) potential Vs2 of each second discharge transistor 0073 are both equal to a potential VGH on the second discharge line 00712. A drain (second electrode) potential Vd2 of each first discharge transistor 0072 is equal to the potential Vpcd of the panel crack detection trace 006, and the potential Vpcd is less than the potential VGH on the second discharge line 00712. That is, when no positive charges are accumulated on the panel crack detection trace 006, Vg2=Vs2=VGH, Vd2=Vpcd<VGH.

When the positive charges are accumulated on the panel crack detection trace 006, the gate potential Vg2 of each second discharge transistor 0073 and the source potential Vs2 of each second discharge transistor 0073 are equal to the potential VGH on the second discharge line 00712. The drain potential Vs2 of each second discharge transistor 0073 is equal to the potential Vpcd of the panel crack detection trace 006, and the potential Vpcd is greater than the potential VGH on the second discharge line 00712. That is, when the positive charges are accumulated on the panel crack detection trace 006, Vg2=Vs2=VGH, Vd2=Vpcd>VGH. At this time, each second discharge transistor 0073 is turned on (that is, the diode is ON), and the positive charges in the panel crack detection trace 006 may be discharged to the second discharge line 00712.

Exemplarily, assuming that the potential VGH on the second discharge line 00712 is 7V, when no positive charges are accumulated on the panel crack detection trace 006, the gate potential and the source potential of the second discharge transistor 0073 are both equal to 7V, which is the potential on the second discharge line 00712. The drain potential of the second discharge transistor 0073 is equal to the potential Vpcd of the panel crack detection trace 006, that is, 0V. At this time, the second discharge transistor 0073 is turned off.

When the positive charges are accumulated on the panel crack detection trace 006, the drain potential of the second discharge transistor 0073 is greater than 7V, and the gate potential and the source potential of the second discharge transistor 0073 are both equal to 7V. At this time, the second discharge transistor 0073 is ON.

The electrostatic discharge dummy circuit 007 included in the display substrate 00 in the embodiment of the present disclosure may discharge the static electricity on the panel crack detection trace 006 to the first electrostatic protection line 0071, thereby preventing other traces in the display substrate 00 from being burned out due to the static electricity accumulated on the panel crack detection trace 006, and improving the yield of the display substrate 00.

Optionally, the plurality of electrostatic discharge dummy circuits 007 included in the display substrate 00 may be uniformly distributed in the peripheral region 001b along the boundary of the display region 001a. By uniformly distributing the electrostatic discharge dummy circuits 007 in the peripheral region 001b, the static electricity on the panel crack detection trace 006 can be effectively discharged, and the yield of the display substrate 00 is ensured. Exemplarily, the plurality of electrostatic discharge dummy circuits 007 may be uniformly distributed in the peripheral region 001b1 proximal to the first boundary 001a1.

Figure 21:
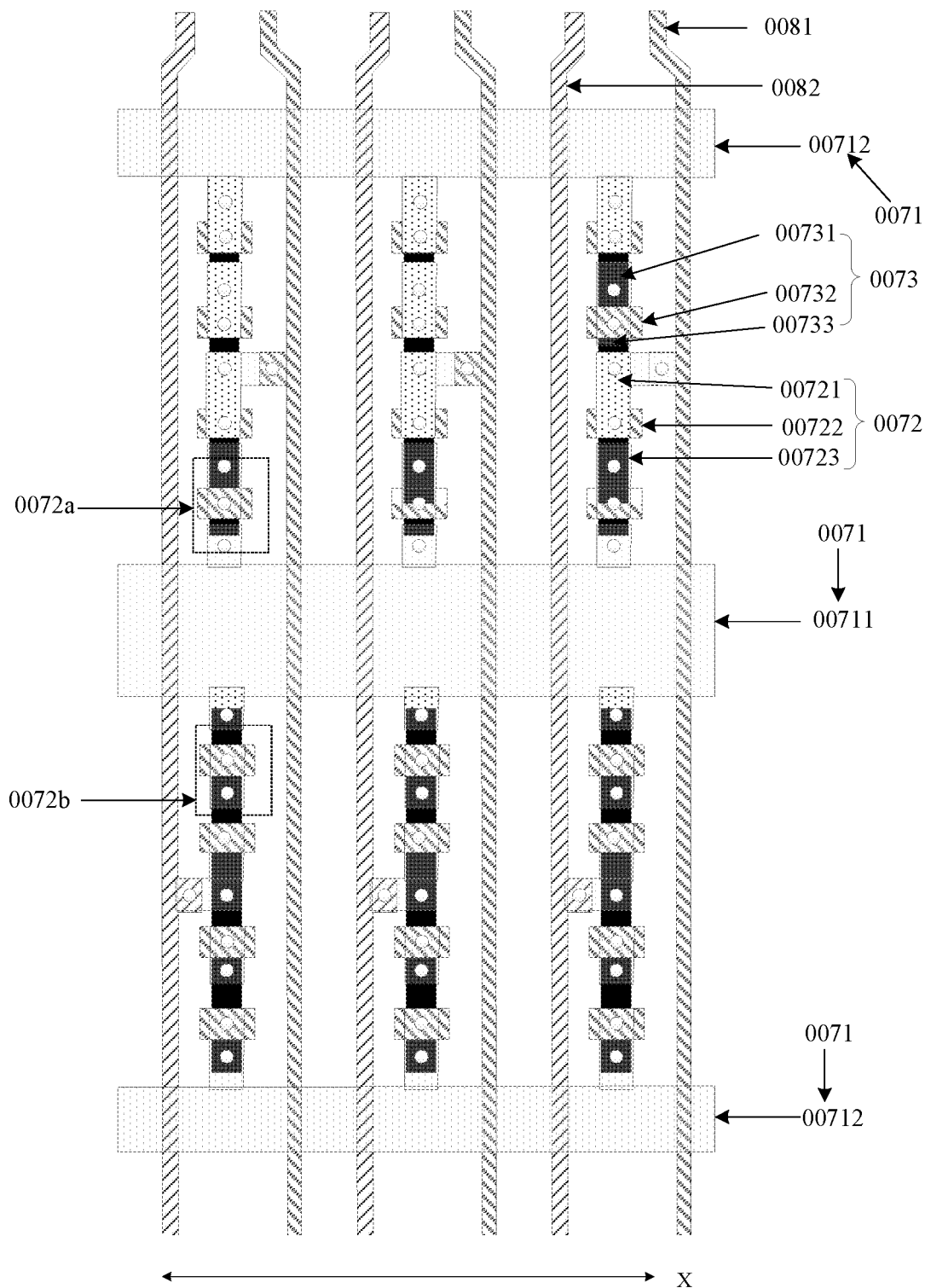
FIG. 21 is a structural schematic diagram of an electrostatic discharge dummy circuit according to an embodiment of the present disclosure.

FIG. 21 is a structural schematic diagram of an electrostatic discharge dummy circuit according to an embodiment of the present disclosure. Referring to FIG. 21, it can be seen that a first electrode 00721 and a gate 00722 of the first discharge transistor 0072 in the electrostatic discharge dummy circuit 007 may be electrically connected to one of the plurality of data transmission dummy lines 008, and a second electrode 00723 may be electrically connected to the first electrostatic protection line 0071. A first electrode 00731 and a gate 00732 of the second discharge transistor 0073 may be electrically connected to the first electrostatic protection line 0071, and a second electrode 00733 may be electrically connected to one of the plurality of data transmission dummy lines 008. The plurality of data transmission lines 004 are connected to the panel crack detection trace 006, such that the static electricity on the panel crack detection trace 006 is discharged to the first electrostatic protection line 0071 through the electrostatic discharge dummy circuit 007.

Referring to FIG. 21, it can be seen that the first discharge transistor 0072 and the second discharge transistor 0073 included in each electrostatic discharge dummy circuit 007 may be disposed between two data transmission dummy lines 008, for example, disposed between the first data transmission dummy line 0081 and the second data transmission dummy line 0082. The extension direction of the first electrostatic protection line 0071 may intersect the extension direction of the data transmission dummy line 008. For example, the extension direction of the first electrostatic protection line 0071 may be perpendicular to the extension direction of the data transmission dummy line 008.

In the embodiment of the present disclosure, referring to FIG. 21, the plurality of electrostatic discharge dummy circuits 007 arranged in parallel to the extension direction of the first discharge line 00711 may share one first discharge line 00711, and two electrostatic discharge dummy circuits 007 arranged perpendicular to the extension direction of the first discharge line 00711 may share one first discharge line 00711. That is, the electrostatic discharge dummy circuits 007 included in the display substrate 00 all share one first discharge line 00711. The plurality of electrostatic discharge dummy circuits 007 arranged in parallel to the extension direction of the second discharge line 00712 may share one second discharge line 00712. For example, the first discharge line 00711 connected to the first discharge transistor 0072a connected to the first data transmission dummy line 0081 and the first discharge line 00711 connected to the first discharge transistor 0072b connected to the second data transmission dummy line 0082 are the same first discharge line 00711.

It should be noted that the first discharge line 00711, the second discharge line 00712, the panel crack detection trace 006, and the source and drain layers of the transistor may be disposed in the same layer. That is, the first discharge line 00711, the second discharge line 00712, the panel crack detection trace 006, and the source and drain layers of the transistor are formed by the same one patterning process.

Alternatively, at least two structures of the first discharge line 00711, the second discharge line 00712, the panel crack detection trace 006, and the source and drain layers of the transistor may be disposed in different layers. For example, the first discharge line 00711, the second discharge line 00712, the panel crack detection trace 006, and the source and drain layers of the transistor are all in different layers. That is, the first discharge line 00711, the second discharge line 00712, the panel crack detection trace 006, and the source and drain layers of the transistor need to be formed by one patterning process respectively, and there are four patterning processes in total.

Figure 22:
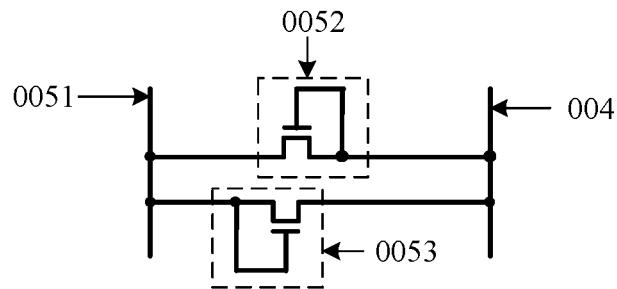
FIG. 22 is a circuit diagram of an electrostatic discharge circuit according to an embodiment of the present disclosure.

FIG. 22 is a circuit diagram of an electrostatic discharge circuit according to an embodiment of the present disclosure. Referring to FIG. 22, it can be seen that the electrostatic discharge circuit 005 may include: a second electrostatic protection line 0051, at least one third discharge transistor 0052, and at least one fourth discharge transistor 0053. Both a first electrode and a gate of the at least one third discharge transistor 0052 are electrically connected to the data transmission line 004, and a second electrode of the at least one third discharge transistor 0052 may be electrically connected to the second electrostatic protection line 0051. A first electrode and a gate of the at least one fourth discharge transistor 0053 may be electrically connected to the second electrostatic protection line 0051, and a second electrode of the at least one fourth discharge transistor 0053 may be electrically connected to the data transmission line 004.

If the static electricity accumulated on the data transmission line 004 is the negative charges, the third discharge transistor 0052 is turned on to conduct the data transmission line 004 and the second electrostatic protection line 0051, and the data transmission line 004 may discharge to the second electrostatic protection line 0051 by the first discharge transistor 0052. That is, the negative charges accumulated on the data transmission line 004 may be discharged to the second electrostatic protection line 0051 through the third discharge transistor 0052.

If the static electricity accumulated on the data transmission line 004 is the positive charges, the fourth discharge transistor 0053 is turned on to conduct the data transmission line 004 and the second electrostatic protection line 0051, and the data transmission line 004 may discharge to the second electrostatic protection line 0051 by the fourth discharge transistor 0053. That is, the positive charges accumulated on the data transmission line 004 may be discharged to the second electrostatic protection line 0051 through the fourth discharge transistor 0053.

Figure 23:
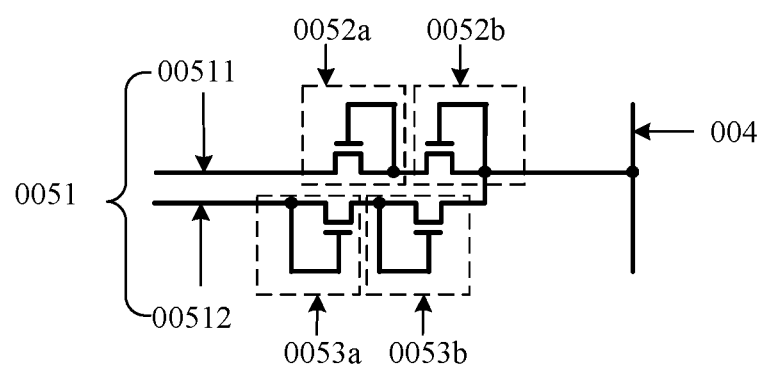
FIG. 23 is a circuit diagram of another electrostatic discharge circuit according to an embodiment of the present disclosure.

In the embodiment of the present disclosure, referring to FIG. 23, the second electrostatic protection line 0051 may include a third discharge line 00511 and a fourth discharge line 00512. In addition, the electrostatic discharge circuit 005 may include: two third discharge transistors 0052 and two fourth discharge transistors 0053.

Referring to FIG. 23, a first electrode and a gate of a first of the third discharge transistor 0052a are both connected to the data transmission line 004, and a second electrode of the first of the third discharge transistor 0052a is connected to a first electrode and a gate of a second of the third discharge transistor 0052b, and a second electrode of the second of the third discharge transistor 0052b is connected to the third discharge line 00511. That is, the first electrode and the gate of the second of the third discharge transistor 0052b may be connected to the third discharge line 00511 by the first of the third discharge transistor 0052a.

A first electrode and a gate of a first of the fourth discharge transistor 0053a are both connected to the fourth discharge line 00512, and a second electrode of the first of the fourth discharge transistor 0053a is connected to a first electrode and a gate of a second of the fourth discharge transistor 0053b. A second electrode of the second of the fourth discharge transistor 0053b is connected to the data transmission line 004. That is, the first electrode and the gate of the second fourth discharge transistor 0053b may be connected to the fourth discharge line 00512 by the first of the fourth discharge transistor 0053a.

The third discharge line 00511 may be a VGL line. The fourth discharge line 00512 may be a VGH line.

Figure 24:
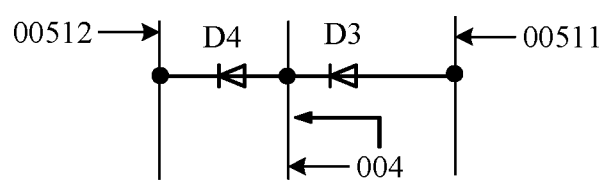
FIG. 24 is a schematic diagram that an electrostatic discharge circuit discharges negative charges according to an embodiment of the present disclosure.

FIG. 24 is a schematic diagram that the electrostatic discharge circuit discharges the negative charges according to an embodiment of the present disclosure. In FIG. 24, the at least one third discharge transistor 0052 is equivalent to a diode D3, and the at least one fourth discharge transistor 0053 is also equivalent to a diode D4. Referring to FIG. 24, when no negative charges are accumulated on the data transmission line 004, a gate potential Vg3 of the third discharge transistor 0052 and a source (that is, the first electrode) potential Vs3 of the third discharge transistor 0052 are equal to the potential Vc of the data transmission line of 004. The potential Vc is greater than the potential VGL on the third discharge line 00511. A drain (that is, the second electrode) potential Vd3 of each third discharge transistor 0052 is equal to the potential VGL on the third discharge line 00511. That is, when no negative charges are accumulated on the data transmission line 004, Vg3=Vs3=Vc>VGL, Vd3=VGL.

When the negative charges are accumulated on the data transmission line 004, the gate potential Vg3 of each third discharge transistor 0052 and the source potential Vs3 of each third discharge transistor 0052 are equal to the potential Vc of the data transmission line 004, and the potential Vc is less than the potential VGL on the third discharge line 00511. The drain potential Vs3 of each third discharge transistor 0052 is equal to the potential VGL on the first discharge line 00511. That is, when the negative charges are accumulated on the data transmission line 004, Vg3=Vs3=Vc<VGL, Vd3=VGL. At this time, each first discharge transistor 0052 is turned on (that is, the diode D3 is ON), and the negative charges in the data transmission line 004 may be discharged to the first discharge line 00511.

Exemplarily, assuming that the potential VGL on the third discharge line 00511 is −7V, and when no negative charges are accumulated on the data transmission line 004, that is, the potential Vc of the data transmission line 004 is 0V (the gate potential and the source potential of the third discharge transistor 0052 are both 0V), that is, greater than −7V. The drain potential Vd3 of the third discharge transistor 0052 is equal to −7V. At this time, the third discharge transistor 0052 is turned off.

When the negative charges are accumulated on the data transmission line 004, the potential on the data transmission line 004 is less than −7V, and the drain potential Vd3 of the third discharge transistor 0052 is equal to −7V. At this time, the third discharge transistor 0052 is ON.

Figure 25:
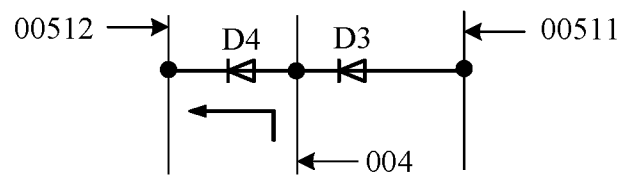
FIG. 25 is a schematic diagram that an electrostatic discharge circuit discharges positive charges according to an embodiment of the present disclosure.

FIG. 25 is a schematic diagram that the electrostatic discharge circuit discharges the positive charges according to an embodiment of the present disclosure. In FIG. 25, the at least one third discharge transistor 0052 is equivalent to a diode D3, and the at least one fourth discharge transistor 0053 is also equivalent to a diode D4. Referring to FIG. 25, when no positive charges are accumulated on the data transmission line 004, a gate potential Vg4 of each fourth discharge transistor 0053 and a source (first electrode) potential Vs4 of each fourth discharge transistor 0053 are equal to the potential VGH on the fourth discharge line 00512. A drain (second electrode) potential Vd3 of each third discharge transistor 0052 is equal to the potential Vc of the data transmission line 004, and the potential Vc is less than the potential VGH on the fourth discharge line 00512. That is, when no positive charges are accumulated on the data transmission line 004, Vg4=Vs4=VGH, Vd4=Vc<VGH.

When the positive charges are accumulated on the data transmission line 004, the gate potential Vg4 of each fourth discharge transistor 0053 and the source potential Vs4 of each fourth discharge transistor 0053 are equal to the potential VGH on the fourth discharge line 00512. The drain potential Vs4 of each fourth discharge transistor 0053 is equal to the potential Vc of the data transmission line 004, and the potential Vc is greater than the potential VGH on the fourth discharge line 00512. That is, when the positive charges are accumulated on the data transmission line 004, Vg4=Vs4=VGH, Vd4=Vc>VGH. At this time, each fourth discharge transistor 0053 is turned on (that is, the diode is ON), and the positive charges in the data transmission line 004 may be discharged to the fourth discharging line 00512.

Exemplarily, assuming that the potential VGH on the fourth discharge line 00512 is 7V, when no positive charges are accumulated on the data transmission line 004, the gate potential and the source potential of the fourth discharge transistor 0053 are both equal to 7V, which is the potential on the fourth discharge line 00512. The drain potential of the fourth discharge transistor 0053 is equal to the potential Vc of the data transmission line 004, that is, 0V. At this time, the fourth discharge transistor 0053 is turned off.

When the positive charges are accumulated on the data transmission line 004, the drain potential of the fourth discharge transistor 0053 is greater than 7V, and the gate potential and the source potential of the fourth discharge transistor 0053 are both equal to 7V. At this time, the fourth discharge transistor 0053 is ON.

The electrostatic discharge circuit 005 included in the display substrate 00 in the embodiment of the present disclosure may discharge the static electricity in the data transmission line 004 to the second electrostatic protection line 0051, and the yield of the display substrate 00 is higher.

Figure 26:
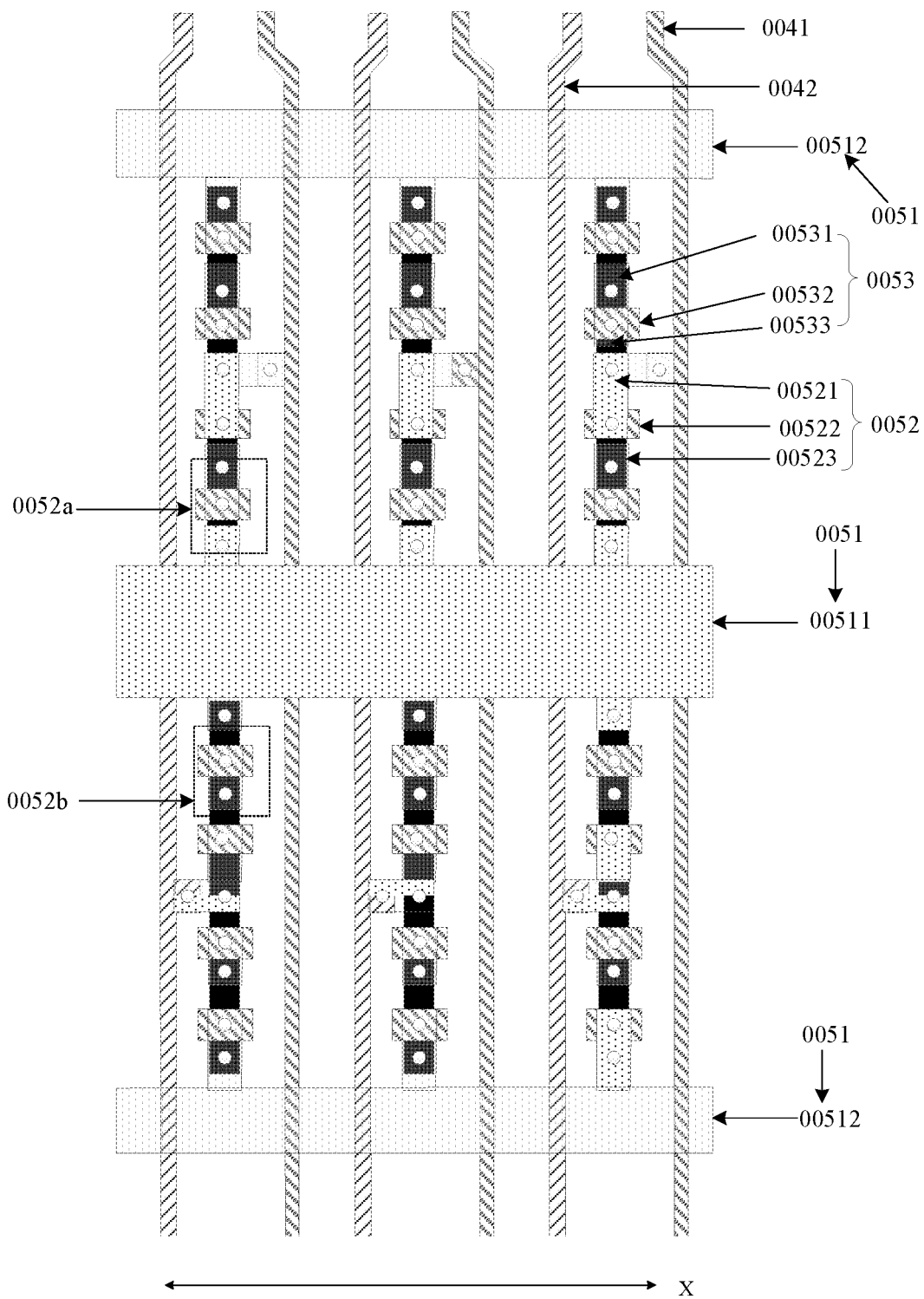
FIG. 26 is a structural schematic diagram of an electrostatic discharge circuit according to an embodiment of the present disclosure.

FIG. 26 is a structural schematic diagram of an electrostatic discharge circuit according to an embodiment of the present disclosure. Referring to FIG. 26, it can be seen that a first electrode 00521 and a gate 00522 of the third discharge transistor 0052 in the electrostatic discharge circuit 005 may be electrically connected to one of the plurality of data transmission lines 004, and a second electrode 00523 may be electrically connected to the second electrostatic protective line 0051. A first electrode 00531 and a gate 00532 of the fourth discharge transistor 0053 may be electrically connected to the second electrostatic protection line 0051, and a second electrode 00533 may be electrically connected to one of the plurality of data transmission lines 004. The plurality of data transmission lines 004 are electrically connected to the data lines 003, such that the static electricity in the data lines 003 is discharged to the second electrostatic protection line 0051 through the electrostatic discharge circuit 007.

Referring to FIG. 26, it can be seen that the third discharge transistor 0052 and the fourth discharge transistor 0053 included in each electrostatic discharge circuit 005 may be disposed between two data transmission lines 004, for example, disposed between the first data transmission line 0041 and the second data transmission line 0042. The extension direction of the second electrostatic protection line 0051 may intersect the extension direction of the data transmission line 004. For example, the extension direction of the second electrostatic protection line 0051 may be perpendicular to the extension direction of the data transmission line 004.

In the embodiment of the present disclosure, referring to FIG. 26, the plurality of electrostatic discharge circuits 005 arranged in parallel to the extension direction of the second discharge line 00511 may share one third discharge line 00511, and two electrostatic discharge circuits 005 arranged perpendicular to the extension direction of the third discharge line 00511 may share one first discharge line 00511. That is, the electrostatic discharge circuits 005 included in the display substrate 00 all share one third discharge line 00511. The plurality of electrostatic discharge circuits 005 arranged in parallel to the extension direction of the fourth discharge line 00512 may share one fourth discharge line 00512. For example, the third discharge line 00511 connected to the third discharge transistor 0052a connected to the first data transmission line 0041 and the third discharge line 00511 connected to the third discharge transistor 0052b connected to the second data transmission line 0042 are the same third discharge line 00511.

It should be noted that the third discharge line 00511, the fourth discharge line 00512, the panel crack detection trace 006, and the source and drain layers of the transistor may be disposed in the same layer. That is, the third discharge line 00511, the fourth discharge line 00512, the panel crack detection trace 006, and the source and drain layers of the transistor are formed by the same one patterning process. Alternatively, at least two structures of the third discharge line 00511, the fourth discharge line 00512, the panel crack detection trace 006, and the source and drain layers of the transistor may be disposed in different layers. For example, the third discharge line 00511, the fourth discharge line 00512, the panel crack detection trace 006, and the source and drain layers of the transistor are all in different layers. That is, the third discharge line 00511, the fourth discharge line 00512, the panel crack detection trace 006, and the source and drain layers of the transistor need to be formed by one patterning process respectively, and there are four patterning processes in total.

It should be noted that the first discharge line 00711 may be connected to the third discharge line 00511, that is, the first discharge line 00711 and the third discharge line 00511 may be the same discharge line. The second discharge line 00712 may be connected to the fourth discharge line 00512, that is, the second discharge line 00712 and the fourth discharge line 00512 may be the same discharge line.

Figure 27:
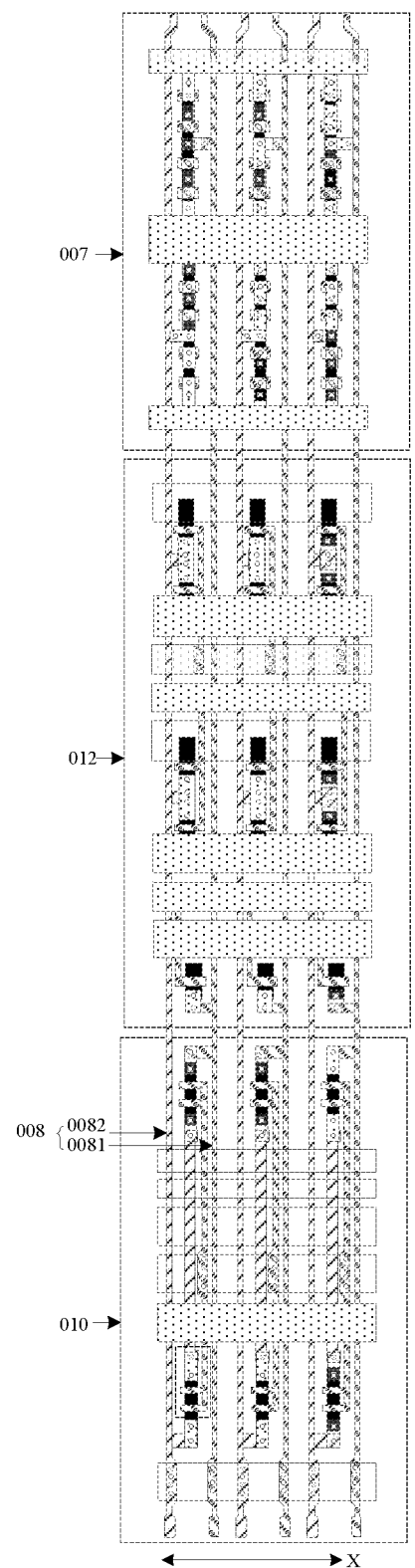
FIG. 27 is a structural schematic diagram of an electrostatic discharge dummy circuit, a first test dummy circuit, and a second test dummy circuit according to an embodiment of the present disclosure.

FIG. 27 is a structural schematic diagram of an electrostatic discharge dummy circuit, a first test dummy circuit, and a second test dummy circuit according to an embodiment of the present disclosure. Referring to FIG. 27, it can be seen that the second test dummy circuit 012 may be disposed between the electrostatic discharge dummy circuit 007 and the first test dummy circuit 010. In addition, the plurality of electrostatic discharge dummy circuits 007 may be connected to the second test dummy circuit 012 by the plurality of data transmission dummy lines 008, and the second test dummy circuit 012 may be electrically connected to the first test dummy circuit 010 by the plurality of data transmission dummy lines 008.

Figure 28:
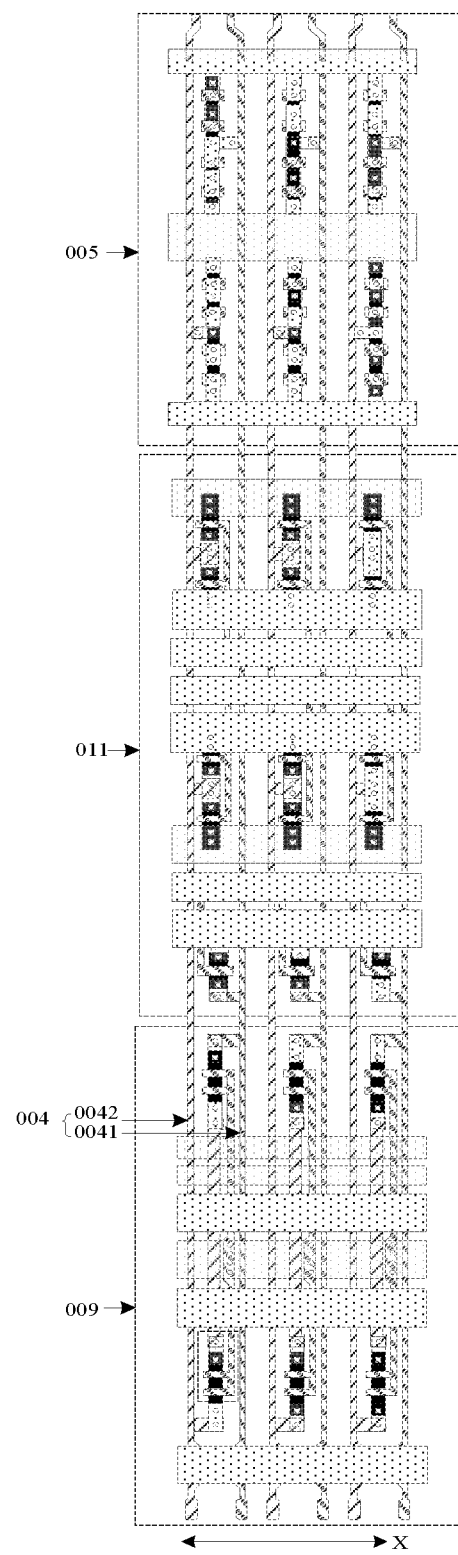
FIG. 28 is a structural schematic diagram of an electrostatic discharge circuit, a first test circuit, and a second test circuit according to an embodiment of the present disclosure.

FIG. 28 is a structural schematic diagram of an electrostatic discharge circuit, a first test circuit, and a second test circuit according to an embodiment of the present disclosure. Referring to FIG. 28, it can be seen that the second test circuit 011 may be disposed between the electrostatic discharge circuit 005 and the first test circuit 009. In addition, the plurality of electrostatic discharge circuits 005 may be electrically connected to the second test circuit 011 by the plurality of data transmission lines 004, and the second test circuit 011 may be electrically connected to the first test circuit 009 by the plurality of data transmission lines 004.

Referring to FIG. 12, it can also be seen that the display substrate 00 may further include: a buffer layer 018, an active layer 019, a first gate insulating layer 020, a second gate insulating layer 021, an interlayer dielectric layer 022, a source and drain layer 023, a passivation layer 024, a flat layer 025, an anode layer 026, a light-emitting layer 027, a cathode layer 028, a pixel defining layer 029, a support layer 030, a first inorganic encapsulation layer 031, an organic encapsulation layer 032, and a second inorganic encapsulation layer 033.

The buffer layer 018 may be disposed on one side of the base substrate 001, the active layer 019 may be disposed on one side of the buffer layer 018 distal from the base substrate 001, and the first gate insulating layer 020 may be disposed on one side of the active layer 019 distal from the buffer layer 018. The gate layer may be disposed on one side of the first gate layer distal from the active layer 019, and the second gate insulating layer 021 may be disposed on one side of the gate layer distal from the first gate insulating layer 020. The interlayer dielectric layer 022 may be disposed on one side of the second gate insulating layer 021 distal from the gate layer, and the source and drain layer 023 may be disposed on one side of the interlayer dielectric layer 022 distal from the second gate insulating layer 021. The passivation layer 024 may be disposed on one side of the source and drain layer 023 distal from the interlayer dielectric layer 022, and the flat layer 025 may be disposed on one side of the passivation layer 024 distal from the source and drain layer. The anode layer 026 may be disposed on one side of the flat layer 025 distal from the passivation layer 024. The pixel defining layer 029 may be disposed on one side of the anode layer 026 distal from the flat layer 025, the support layer 030 may be disposed on one side of the pixel defining layer 029 distal from the flat layer 025, the light-emitting layer 027 may be disposed on one side of the anode layer 026 distal from the flat layer 025, and the cathode layer 028 may be disposed on one side of the light-emitting layer 027 distal from the anode layer 026. The first inorganic encapsulation layer 031 may be disposed on one side of the cathode layer 028 distal from the light-emitting layer 027, and the organic encapsulation layer 032 may be disposed on one side of the first inorganic encapsulation layer 031 distal from the cathode layer 028. The second inorganic encapsulation layer 033 may be disposed on one side of the organic encapsulation layer 032 distal from the first inorganic encapsulation layer 031.

In summary, the embodiment of the present disclosure provides a display substrate. The display substrate includes: the base substrate, the plurality of sub-pixels, the plurality of data lines, the plurality of data transmission lines, the plurality of electrostatic discharge circuits, the panel crack detection trace, and the plurality of electrostatic discharge dummy circuits. At least one of the plurality of electrostatic discharge dummy circuits may be connected to the panel crack detection trace. According to the solution provided by the present disclosure, the static electricity accumulated on the panel crack detection trace can be released through the electrostatic discharge dummy circuits, thereby preventing other traces in the display substrate from being burnt out due to the static electricity accumulated on the panel crack detection trace, and improving a yield of the display substrate.

The embodiment of the present disclosure also provides a display device, which may include the display substrate in the foregoing embodiments.

Optionally, the display device may be any product or component with a display function, such as a liquid crystal display device, electronic paper, an organic light-emitting diode (OLED) display device, an active-matrix organic light-emitting diode (AMOLED) display device, a mobile phone, a tablet computer, a television, a monitor, a notebook computer, a digital photo frame, or a navigator.

The above description is only preferred embodiments of the present disclosure, and is not intended to limit the present disclosure. Any modifications, equivalent replacements, improvements and the like made within the spirit and principles of the present disclosure should be included within the scope of protection of the present disclosure.

What is claimed is:

1. A display substrate, comprising:
   a base substrate comprising a display region and a peripheral region surrounding the display region;
   a plurality of sub-pixels disposed in the display region; a plurality of data lines disposed in the display region and electrically connected to the plurality of sub-pixels;
   a plurality of data transmission lines disposed in the peripheral region and electrically connected to the plurality of data lines;
   a plurality of electrostatic discharge circuits disposed in the peripheral region and electrically connected to the plurality of data transmission lines, wherein the plurality of electrostatic discharge circuits are arranged along an extension direction of a boundary of the display region;
   a panel crack detection trace disposed in the peripheral region and surrounding the display region; and
   a plurality of electrostatic discharge dummy circuits disposed in the peripheral region and arranged along the extension direction of the boundary of the display region, wherein the plurality of electrostatic discharge dummy circuits are disposed on at least one side of the plurality of electrostatic discharge circuits along the extension direction of the boundary of the display region, and at least one of the plurality of electrostatic discharge dummy circuits is electrically connected to the panel crack detection trace and configured to discharge static electricity on the panel crack detection trace,
   wherein the plurality of electrostatic discharge dummy circuits includes a first electrostatic protection line for discharging static electricity and the plurality of electrostatic discharge circuits includes a second electrostatic protection line for discharging static electricity, and the first electrostatic protection line and the second electrostatic protection line are shared.

2. The display substrate according to claim 1, wherein the boundary of the display region comprises a first boundary, a second boundary, a third boundary, and a fourth boundary which are sequentially connected, and the plurality of electrostatic discharge circuits and the plurality of electrostatic discharge dummy circuits are disposed in the peripheral region proximal to the first boundary; and
   the plurality of electrostatic discharge dummy circuits comprise a plurality of first electrostatic discharge dummy sub-circuits and a plurality of second electrostatic discharge dummy sub-circuits;

wherein the plurality of first electrostatic discharge dummy sub-circuits and the plurality of second electrostatic discharge dummy sub-circuits are respectively disposed on two sides of the plurality of electrostatic discharge circuits along an extension direction of the first boundary.

3. The display substrate according to claim 1, wherein the panel crack detection trace comprises: a first trace segment, a second trace segment, and a third trace segment; wherein
the first trace segment is a discontinuous trace, and disposed in the peripheral region proximal to the first boundary of the display region, and the first trace segment is extended along the extension direction of the first boundary;
the second trace segment is a continuous trace, and disposed in the peripheral region proximal to the first boundary, the second boundary, and the third boundary, wherein two endpoints of the second trace segment are disposed in the peripheral region proximal to the first boundary;
the third trace segment is a continuous trace, and disposed in the peripheral region proximal to the third boundary, the fourth boundary, and the first boundary, wherein two endpoints of the third trace segment are disposed in the peripheral region proximal to the first boundary, and the second trace segment and the third trace segment are connected to the first trace segment; and
the plurality of electrostatic discharge dummy circuits are electrically connected to the first trace segment.

4. The display substrate according to claim 3, wherein the first trace segment comprises: a first sub-trace, a second sub-trace, and a third sub-trace which are extended along the extension direction of the first boundary, wherein the first sub-trace and the second sub-trace are disposed on one side of the third sub-trace proximal to the display region;
the first sub-trace and the third sub-trace are respectively connected to two endpoints of the second trace segment, and the second sub-trace and the third sub-trace are respectively connected to two endpoints of the third trace segment; and
the plurality of electrostatic discharge dummy circuits are electrically connected to the third sub-trace.

5. The display substrate according to claim 4, wherein the display substrate further comprises: a plurality of data transmission dummy lines, wherein the plurality of electrostatic discharge dummy circuits are electrically connected to the third sub-trace by the plurality of data transmission dummy lines.

6. The display substrate according to claim 5, wherein the display substrate further comprises: a plurality of first test circuits disposed on one side of the plurality of electrostatic discharge circuits distal from the display region, wherein the plurality of first test circuits are extended and arranged along the extension direction of the first boundary;
at least one of the plurality of first test circuits comprises: a first thin film transistor, a first control line, a first test data line, and a second test data line, wherein the first control line, the first test data line, and the second test data line are disposed in the peripheral region and extended along the extension direction of the first boundary; and
the first thin film transistor comprises: a first source, a first drain, and a first gate, wherein the first gate is electrically connected to the first control line, the first source is electrically connected to the first test data line, the second test data line and one of the first sub-trace and the second sub-trace, and the first drain is electrically connected to one of the plurality of data transmission lines.

7. The display substrate according to claim 6, wherein the display substrate further comprises: a plurality of first test dummy circuits, wherein the plurality of first test dummy circuits are disposed on two sides of the plurality of first test circuits and between the plurality of electrostatic discharge dummy circuits and the third sub-trace along the extension direction of the first boundary, and the plurality of first test dummy circuits are electrically connected to the third sub-trace and the electrostatic discharge dummy circuits by the plurality of data transmission dummy lines.

8. The display substrate according to claim 7, wherein at least one of the plurality of first test dummy circuits comprises: a first dummy thin film transistor and a second control line, wherein the second control line is disposed in the peripheral region and extended along the extension direction of the first boundary, and the first dummy thin film transistor comprises: a first dummy source, a first dummy drain, and a first dummy gate;
wherein the first dummy gate is electrically connected to the second control line, and the first dummy drain is electrically connected to one of the plurality of data transmission dummy lines.

9. The display substrate according to claim 7, wherein the number of the electrostatic discharge dummy circuits is equal to the number of the first test dummy circuits, and each of the electrostatic discharge dummy circuits is electrically connected to the third sub-trace by one of the first test dummy circuits.

10. The display substrate according claim 6, wherein the display substrate further comprises: a plurality of second test circuits, wherein the plurality of second test circuits are disposed between the plurality of electrostatic discharge circuits and the plurality of first test circuits, and the plurality of second test circuits are electrically connected to the plurality of electrostatic discharge circuits and the plurality of first test circuits by the plurality of data transmission lines.

11. The display substrate according to claim 10, wherein at least one of the plurality of second test circuits comprises: a first sub-circuit, a second sub-circuit, and a third sub-circuit, wherein the second sub-circuit is disposed between the first sub-circuit and the third sub-circuit, and the first sub-circuit is disposed on one side of the second sub-circuit distal from the plurality of sub-pixels.

12. The display substrate according to claim 10, wherein the display substrate further comprises: a plurality of second test dummy circuits, wherein the plurality of second test dummy circuits are disposed on two sides of the plurality of second test circuits and disposed between the plurality of electrostatic discharge dummy circuits and the plurality of first test dummy circuits along the extension direction of the first boundary, and the plurality of second test dummy circuits are electrically connected to the first test dummy circuits and the electrostatic discharge dummy circuits by the plurality of data transmission dummy lines.

13. The display substrate according to claim 12, wherein at least one of the plurality of second test dummy circuits comprises: a first dummy sub-circuit, a second dummy sub-circuit, and a third dummy sub-circuit, wherein the second dummy sub-circuit is disposed between the first dummy sub-circuit and the third dummy sub-circuit, and the first dummy sub-circuit is disposed on one side of the second dummy sub-circuit distal from the plurality of sub-pixels.

14. The display substrate according to claim 12, wherein the number of the second test dummy circuits, the number of the electrostatic discharge dummy circuits, and the number of the first test dummy circuits are equal, and each of the electrostatic discharge dummy circuits is electrically connected to one of the first test dummy circuits by one of the second test dummy circuits.

15. The display substrate according to claim 1, wherein the display substrate further comprises: at least one first signal input terminal; wherein
the at least one first signal input terminal is connected to the third sub-trace in the first trace segment in the panel crack detection trace, and the at least one first signal input terminal is configured to receive a test signal to detect the display substrate.

16. The display substrate according to claim 15, wherein the at least one first signal input terminal comprises two first signal input terminals, wherein the two first signal input terminals are respectively disposed on two sides of the first test circuits.

17. The display substrate according to claim 1, wherein the display substrate further comprises: a first detection terminal and a second detection terminal; wherein
the first detection terminal is connected to the first sub-trace in the first trace segment in the panel crack detection trace, and configured to provide a detection signal for the first sub-trace; and
the second detection terminal is connected to the second sub-trace in the first trace segment in the panel crack detection trace, and configured to receive the detection signal to detect the display substrate.

18. The display substrate according to claim 1, wherein at least one of the plurality of electrostatic discharge dummy circuits comprises: at least one first discharge transistor, and at least one second discharge transistor; wherein both a first electrode and a gate of the at least one first discharge transistor are electrically connected to the panel crack detection trace, and a second electrode of the at least one first discharge transistor is electrically connected to the first electrostatic protection line; and both a first electrode and a gate of the at least one second discharge transistor are electrically connected to the first electrostatic protection line, and a second electrode of the at least one second discharge transistor is electrically connected to the panel crack detection trace.

19. The display substrate according to claim 1, wherein the plurality of electrostatic discharge dummy circuits are uniformly distributed in the peripheral region along the boundary of the display region.

20. A display device, comprising: a display substrate, wherein the display substrate comprises:
a base substrate comprising a display region and a peripheral region surrounding the display region;
a plurality of sub-pixels disposed in the display region;
a plurality of data lines disposed in the display region and electrically connected to the plurality of sub-pixels;
a plurality of data transmission lines disposed in the peripheral region and electrically connected to the plurality of data lines;
a plurality of electrostatic discharge circuits disposed in the peripheral region and electrically connected to the plurality of data transmission lines, wherein the plurality of electrostatic discharge circuits are arranged along an extension direction of a boundary of the display region;
a panel crack detection trace disposed in the peripheral region and surrounding the display region; and
a plurality of electrostatic discharge dummy circuits disposed in the peripheral region and arranged along the extension direction of the boundary of the display region, wherein the plurality of electrostatic discharge dummy circuits are disposed on at least one side of the plurality of electrostatic discharge circuits along the extension direction of the boundary of the display region, and at least one of the plurality of electrostatic discharge dummy circuits is electrically connected to the panel crack detection trace and configured to discharge static electricity on the panel crack detection trace,
wherein the plurality of electrostatic discharge dummy circuits includes a first electrostatic protection line for discharging static electricity and the plurality of electrostatic discharge circuits includes a second electrostatic protection line for discharging static electricity, and the first electrostatic protection line and the second electrostatic protection line are shared.

* * * * *